(12) United States Patent
Wells

(10) Patent No.: US 7,396,781 B2
(45) Date of Patent: Jul. 8, 2008

(54) METHOD AND APPARATUS FOR ADJUSTING FEATURE SIZE AND POSITION

(75) Inventor: David H. Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 11/150,408

(22) Filed: Jun. 9, 2005

(65) Prior Publication Data
US 2006/0281266 A1    Dec. 14, 2006

(51) Int. Cl.
*H01L 21/00* (2006.01)

(52) U.S. Cl. ............... 438/946; 438/947; 257/E21.038; 257/E21.039; 716/19

(58) Field of Classification Search ................ 438/946, 438/947; 257/E21.038, E21.039; 716/19
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattascharyya et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |

(Continued)

FOREIGN PATENT DOCUMENTS

DE             280851         7/1990

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner*—Asok K Sarkar
(74) *Attorney, Agent, or Firm*—Knobbe Martens Olson & Bear LLP

(57) ABSTRACT

Variations in the pitch of features formed using pitch multiplication are minimized by separately forming at least two sets of spacers. Mandrels are formed and the positions of their sidewalls are measured. A first set of spacers is formed on the sideswalls. The critical dimension of the spacers is selected based upon the sidewall positions, so that the spacers are centered at desired positions. The mandrels are removed and the spacers are used as mandrels for a subsequent spacer formation. A second material is then deposited on the first set of spacers, with the critical dimensions of the second set of spacers chosen so that these spacers are also centered at their desired positions. The first set of spacers is removed and the second set is used as a mask for etching a substrate. By selecting the critical dimensions of spacers based partly on the measured position of mandrels, the pitch of the spacers can be finely controlled.

43 Claims, 29 Drawing Sheets

U.S. PATENT DOCUMENTS

| | | |
|---|---|---|
| 5,330,879 A | 7/1994 | Dennison |
| 5,514,885 A | 5/1996 | Myrick |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,475,867 B1 | 11/2002 | Hui et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,773,998 B1 | 8/2004 | Fisher et al. |
| 6,794,699 B2 | 9/2004 | Bissey et al. |
| 6,800,930 B2 | 10/2004 | Jackson et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,962,867 B2 | 11/2005 | Jackson et al. |
| 7,015,124 B1 | 3/2006 | Fisher et al. |
| 7,084,076 B2 | 8/2006 | Park et al. |
| 7,183,597 B2 | 2/2007 | Doyle |
| 7,208,379 B2 | 4/2007 | Venugopal et al. |
| 2001/0005631 A1 | 6/2001 | Kim et al. |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0127810 A1 | 9/2002 | Nakamura et al. |
| 2003/0006410 A1 | 1/2003 | Doyle |
| 2003/0044722 A1 | 3/2003 | Hsu et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0230234 A1 | 12/2003 | Nam et al. |
| 2004/0000534 A1 | 1/2004 | Lipinski |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0041189 A1 | 3/2004 | Voshell et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2004/2035255 | 11/2004 | Tanaka |
| 2005/0074949 A1 | 4/2005 | Jung et al. |
| 2005/0164454 A1 | 7/2005 | Leslie |
| 2005/0186705 A1 | 8/2005 | Jackson et al. |
| 2005/0272259 A1 | 12/2005 | Hong |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0172540 A1 | 8/2006 | Marks et al. |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0215960 A1 | 9/2007 | Zhu et al. |

FOREIGN PATENT DOCUMENTS

| | | |
|---|---|---|
| DE | 42 36 609 A1 | 5/1994 |
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| WO | WO 02/099864 A1 | 12/2002 |
| WO | WO 2004/001799 A2 | 12/2003 |
| WO | WO 2004/003977 A2 | 1/2004 |
| WO | WO 2005/010973 | 2/2005 |
| WO | WO 2005/034215 A1 | 4/2005 |
| WO | WO 2006-026699 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing, XXI, vol. 5376, John. L. Sturtevant, editor, 2004, 8 pages.

Chung et al., "Pattern multiplication method and the uniformity of nanoscale multiple lines*," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

"U.S. Appl. No. 11/543,515; filed Oct. 24, 2006, MICRON Ref. No. 2005-1173.00/US."

Ex Parte Cantell, unpublished decision of the Board of Patent Appeals and Interferences, Mar. 4,2005.

Choi et al., "Sublithographic nanofabrication technology for nanocatalysts and DNA chips," *J. Vac. Sci. Technol.*, pp. 2951-2955 (Nov./Dec. 2003).

METHOD AND APPARATUS FOR ADJUSTING FEATURE SIZE AND POSITION

REFERENCE TO RELATED APPLICATIONS

This application is related to the following: U.S. patent application Ser. No. 10/934,778 to Abatchev et al., filed Sep. 2, 2004; and U.S. Patent Provisional Application No. 60/662,323 to Tran et al., filed Mar. 15, 2005, entitled Pitch Reduced Patterns Relative To Photolithography Features.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency, integrated circuits are continuously being reduced in size. The sizes of the constituent features that form the integrated circuits, e.g., electrical devices and interconnect lines, are also constantly being decreased to facilitate this size reduction.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In its most general form, a memory cell typically consists of two electrical devices: a storage device (e.g., capacitor) and an access field effect transistor. Each memory cell is an addressable location that can store one bit (binary digit) of data. A bit can be written to a cell through the transistor and can be read by sensing charge in the capacitor. By decreasing the sizes of the electrical devices that constitute a memory cell and the sizes of the conducting lines that access the memory cells, the memory devices can be made smaller. Storage capacities and speeds can be increased by fitting more memory cells on a given area in the memory devices.

The continual reduction in feature sizes places ever greater demands on the techniques used to form the features. For example, photolithography is commonly used to pattern features, such as conductive lines. The concept of pitch can be used to describe the sizes of these features. Pitch is defined as the distance between an identical point in two neighboring features. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a resolution limit that results in a minimum pitch below which a particular photolithographic technique cannot reliably form features. Thus, the minimum pitch of a photolithographic technique is an obstacle to continued feature size reduction.

"Pitch doubling" or "pitch multiplication" is one proposed method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. The layer 50 is deposited to a thickness 90, which corresponds to the desired critical dimension (CD) of spacers 60 (FIG. 1D). Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased. The spacers 60 can then be used as part of mask to etch a pattern into the underlying substrate 30.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

It will be appreciated that photolithography has a certain margin of error when defining feature boundaries, such as those of the lines 10. Thus, the lines 10 can exhibit deviations, or errors, from desired critical dimensions, and these errors can be transferred to the mandrels 40. The processes used to transfer the pattern of lines 10 to the layer 20 and the processes used to etch the mandrels 40 can also exhibit a margin of error when removing mandrel material. Because the spacing between the spacers 60 is dependent upon the critical dimensions of the mandrels 40, errors in the critical dimensions of the mandrels 40 can result in the spacers 60 being incorrectly positioned. As a result, the spacers 60 can have a pitch that deviates from the pitch that is desired, thereby degrading the uniformity and ultimate quality of the integrated circuits patterned using the spacers 60.

Accordingly, there is a need for methods of minimizing variations in the positions of pitch multiplied features.

SUMMARY OF THE INVENTION

According to one aspect of the invention, a method is provided for semiconductor processing. The method comprises providing a plurality of mandrels over a semiconductor substrate. Critical dimensions of the mandrels are measured and critical dimensions of a first plurality of spacers are selected based upon the critical dimensions of the mandrels. The first plurality of spacers of a first spacer material is formed on sidewalls of the mandrels.

According to another aspect of the invention, a method is provided forming an integrated circuit. The method comprises defining a pattern in a photoresist layer over a substrate by a photolithographic technique. The pattern is transferred from the photoresist layer to an underlying layer of temporary material. Transferring the pattern from the photoresist layer forms a plurality of temporary placeholders in the layer of temporary material across a region over the substrate. The position of sidewalls of the temporary placeholders is determined and a layer of spacer material is deposited on the temporary placeholders. A thickness of the layer of spacer material is adjusted based upon the position of the sidewalls. The spacer material is preferentially removed from horizontal surfaces to form a plurality of vertically extending spacers on sidewalls of the temporary placeholders. The temporary placeholders are preferentially removed and the substrate is processed through a mask pattern defined by the plurality of spacers.

According to yet another aspect of the invention, a method is provided for semiconductor processing. The method comprises forming a plurality of mandrels over a substrate. The mandrels have an average pitch of about 2F and an average variation in critical dimension of $\Delta C$ relative to a desired mandrel critical dimension. A first set of spacers is formed immediately adjacent each of the mandrels. The first set of spacers have an average critical dimension of about $t_{c1}$, wherein $t_{c1}$ is given by the formula: $t_{c1}=F/n-\Delta C$, wherein n is a desired degree of pitch multiplication.

According to another aspect of the invention, a method is provided for semiconductor processing. The method comprises providing a mandrel over a substrate. The mandrel has an actual critical dimension that differs by a mandrel variation amount from a target critical dimension for the mandrel. Spacers are formed on vertically-extending sides of the mandrel. The spacers each have a modified width that differs by a spacer variation amount from a target width. The actual separation distance between center points of the actual widths is about equal to a target separation distance between center points of the target widths.

According to yet another aspect of the invention, a method is provided for manufacturing an integrated circuit. The method comprises forming a plurality of mandrels over a substrate in a reaction chamber. The substrate is tranferred from the reaction chamber to a measurement station to perform a measurement of the mandrels after forming the plurality of mandrels. After performing the measurement, the substrate is transferred to a reaction chamber. A layer of spacer material is deposited on sidewalls of the mandrels and a thickness of the layer is selected based upon the measurement. The layer of spacer material is etched to form spacers on the sidewalls and the mandrels are selectively removed to leave free-standing spacers.

According to another aspect of the invention, a method is provided for processing a semiconductor substrate. The method comprises selecting a photolithographic system to define features in a photoresist layer. The photolithographic system has a minimum definable feature size and a critical dimension of the features is more than about 150% of the minimum definable feature size. The features in the photoresist layer are defined using the photolithographic system. A pattern formed by the features is transferred to an underlying layer to form a plurality of mandrels. Spacers are formed on sidewalls of the mandrels and the mandrels are preferentially removed relative to the spacers.

According to yet another aspsect of the invention, a method is provided for fabricating an integrated circuit. The method comprises performing pitch multiplication using features defined by photolithography in a photoresist layer over a substrate. The features define mandrels and are at least about 150% larger than a smallest photolithographically-defined, non-pitch multiplied feature formed in the integrated circuit.

BRIEF DESCRIPTION OF THE DRAWINGS

The invention will be better understood from the Detailed Description of the Preferred Embodiments and from the appended drawings, which are meant to illustrate and not to limit the invention, and wherein:

FIG. 6a is a schematic, cross-sectional side view showing an enlargement of a portion of the partially formed integrated circuit of FIG. 6, in accordance with preferred embodiments of the invention;

DETAILED DESCRIPTION OF THE PREFERRED EMBODIMENTS

Figure 1A:
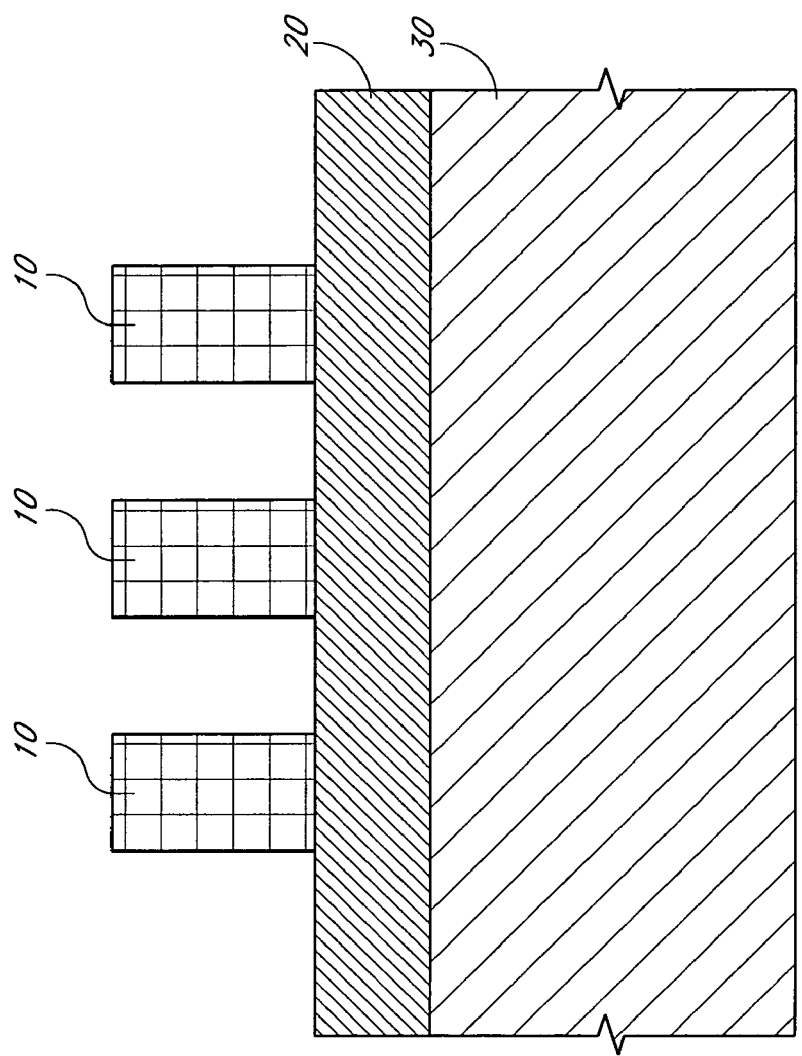
FIGS. 1A-1F are schematic, cross-sectional side views of a sequence of masking patterns for forming conductive lines, in accordance with a prior art pitch doubling method.
Figure 1B:
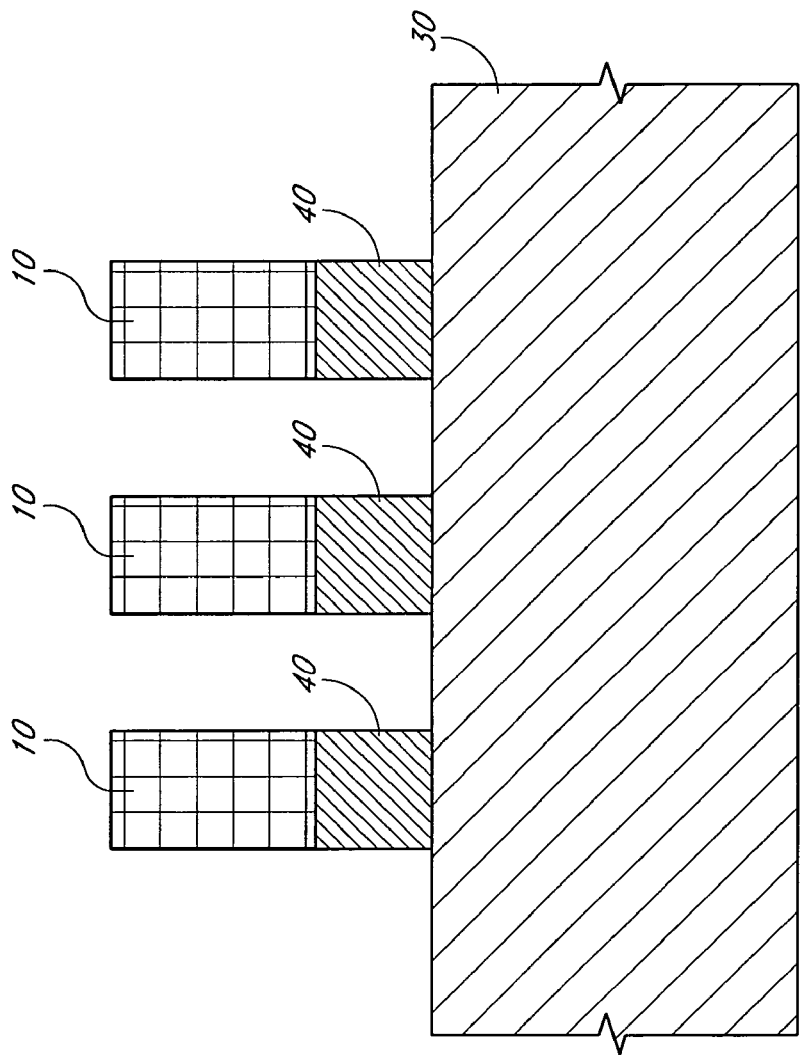
Figure 1C:
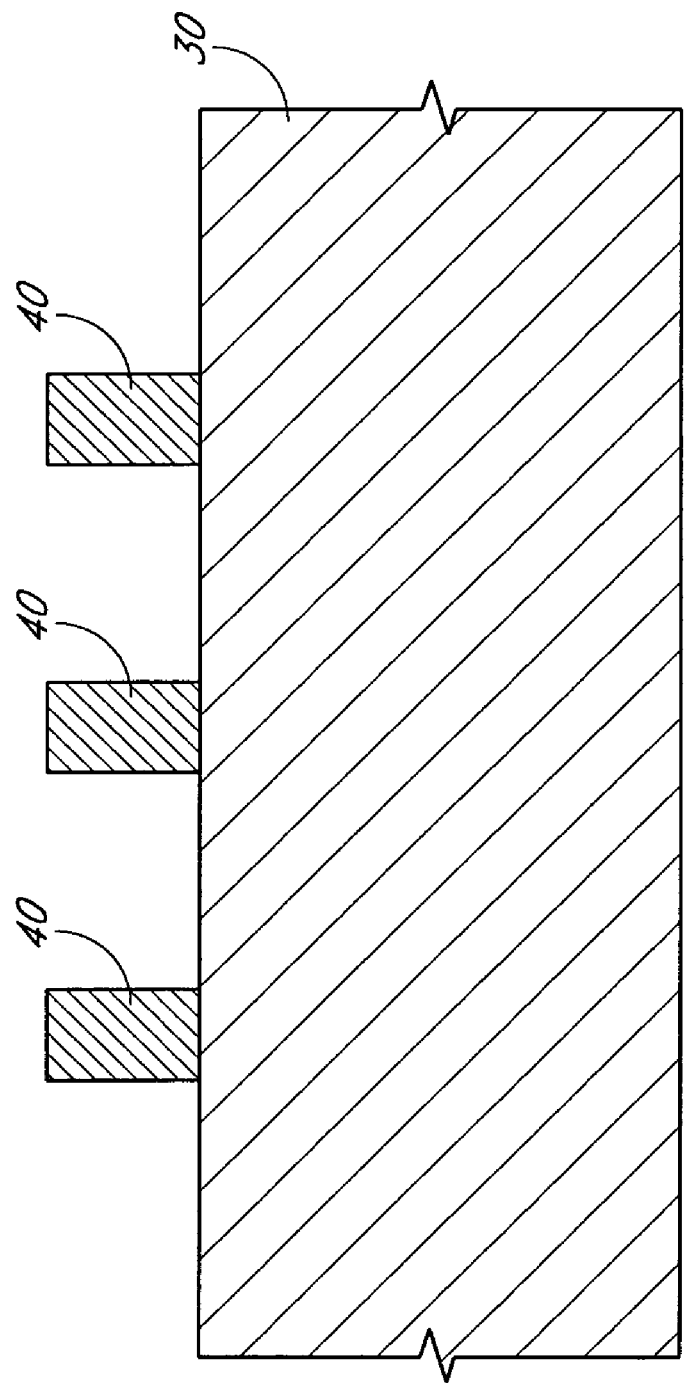
Figure 1D:
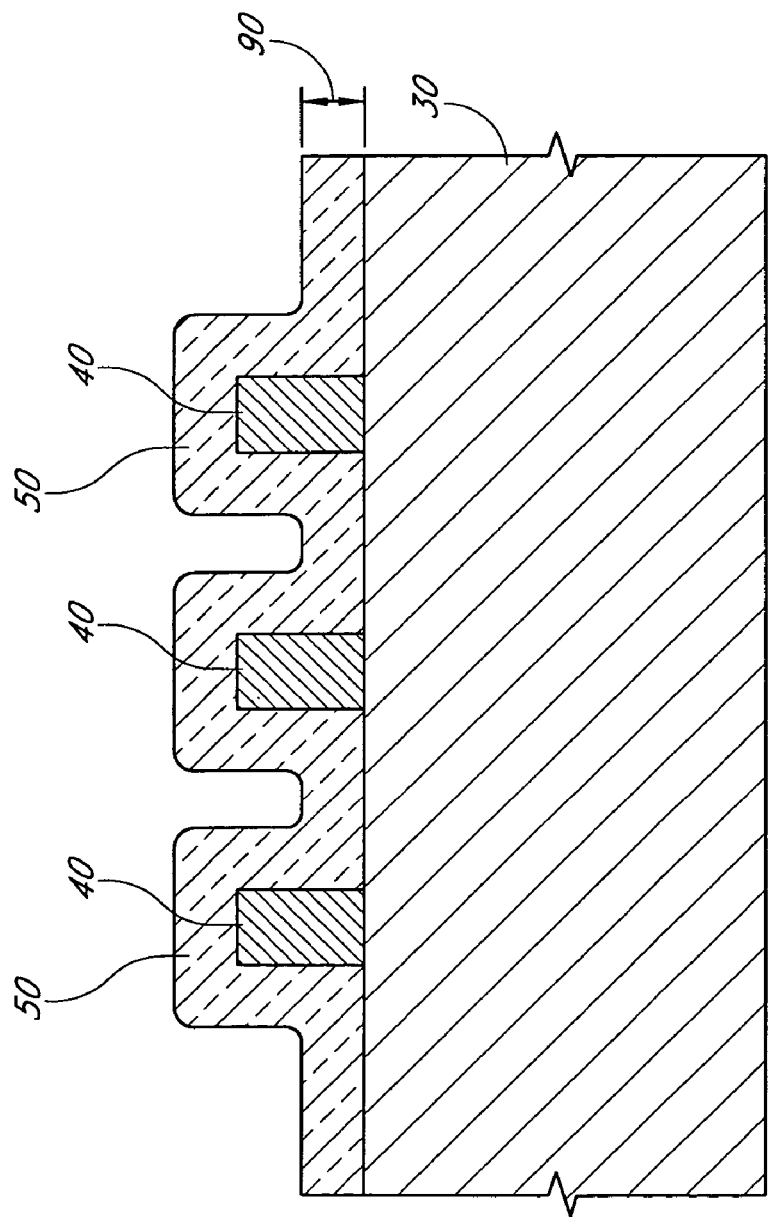
Figure 1E:
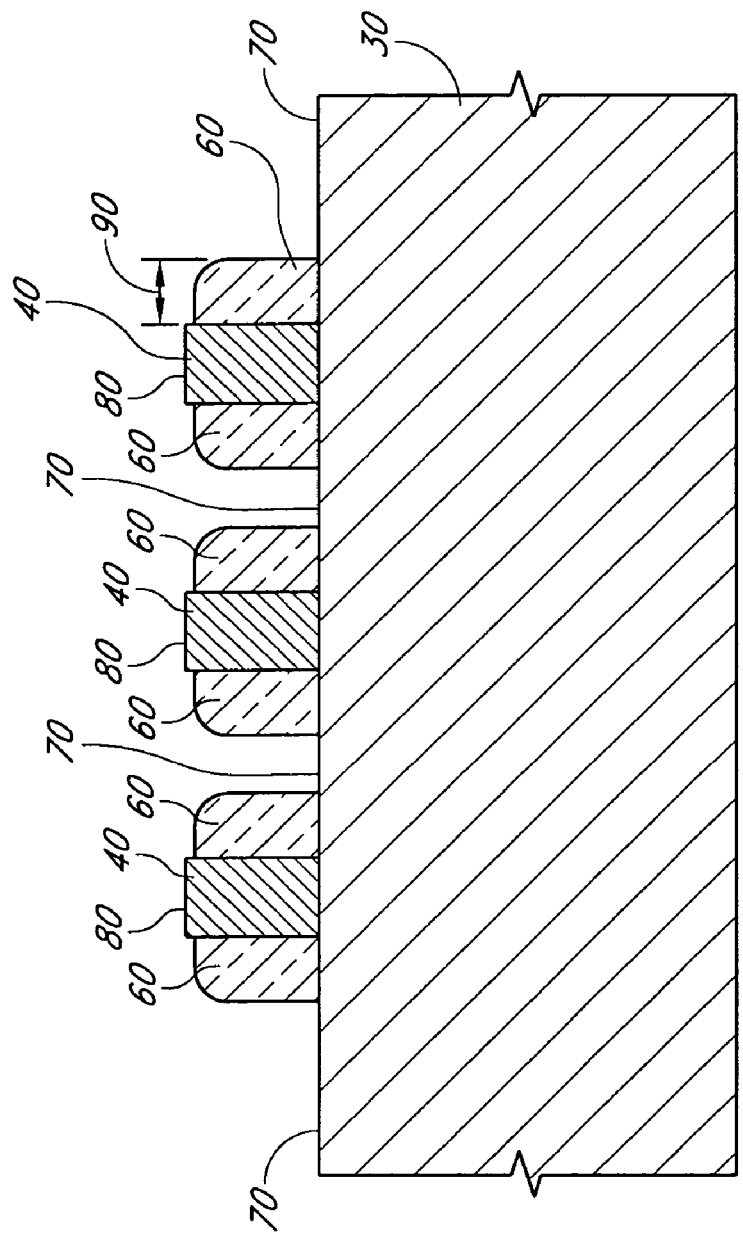
Figure 1F:
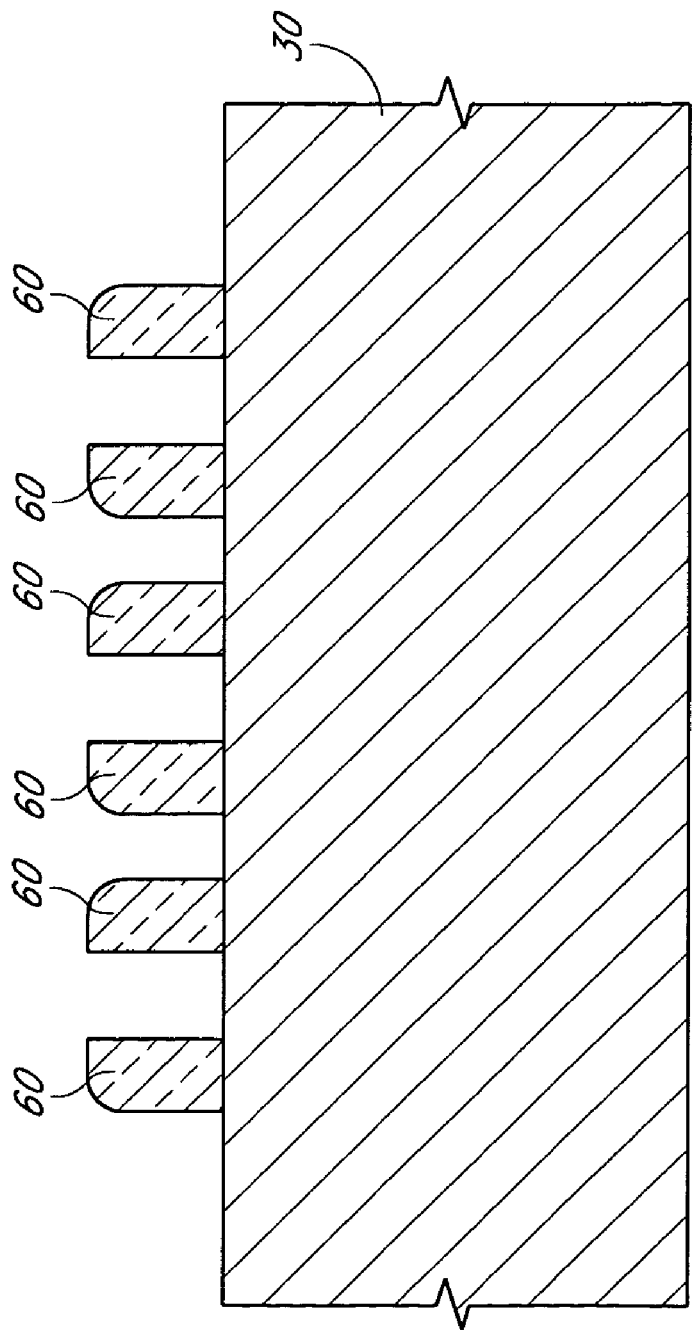

Due to the continuing trend to decrease feature sizes, lower wavelength photolithographic techniques may be used to pattern photoresist to define features used in pitch multiplication. In addition, these techniques may be pushed near their resolution limits to form ever smaller features, such as the mandrels used in pitch multiplication. At the resolution limits, however, the margins of error for forming features of a desired, or target, size increase; variations in the critical dimensions of features formed by photolithography increase as the resolution limits are approached. For example, 100 nm features can be formed with a variation of about ±15 nm, 200 nm features with a variation of about ±10 nm and 300 nm features with a variation of about ±7 nm. The larger margins of error in photoresist feature sizes lead to larger variations in mandrel size. As a result, the above-described problems with pitch regularity are exacerbated by attempts to define ever smaller features by photolithography.

In addition, while mandrels or the resist defining them can be etched to reduce their size, so that photolithography is not required to pattern very small mandrels, reductions in mandrel size, by themselves, do not alter the pitch of later-formed spacers. The pitch of the spacers is determined by the number of mandrels over a distance, not simply by the widths of individual mandrels. In addition, mandrel etches cannot typically be performed as controllably as, e.g., spacer material depositions. Thus, any additional etching of the mandrels may increase variations in mandrel dimensions and, ultimately, variations in spacer pitch.

It will be appreciated that, in a relative sense, variations in pitch can be more problematic than variations in the critical dimensions (CD's) of features. For example, pitch variations can cause misalignments in the electrical features patterned by the spacers. These misalignments can, in turn, cause, e.g., shorts or poor electrical connections with other features. With pitch variation, these problems in one location can propagate to the rest of the circuit, whereas variations in CD without variations in pitch will generally only cause local problems.

In preferred embodiments of the invention, in a feed forward method for controlling the pitch of spacers, a relatively large first set of mandrels is formed. To form spacers having desired critical dimensions, pitch multiplication can be performed a plurality of times, by forming spacers on the mandrels and then removing the mandrels and using the remaining spacers as a second set of mandrels for forming additional spacers. Advantageously, the relatively large size of the first set of mandrels allows them to be patterned without approaching the limits of a photolithographic technique, thereby giving a relatively small margin of error (in comparison to errors that would occur if the dimensions of the mandrels were sized so that the same spacer pitch was achieved only by pitch doubling). For example, the mandrels for a 4× pitch multiplication (a pitch "quadrupling") can be twice as large as that for a pitch doubling, to form spacers with the same pitch. Thus, variations in the critical dimensions of the mandrels stemming from the margin of error of photolithography can be reduced.

To further improve the regularity of the spacers, the positions of the mandrels are measured and at least two depositions of spacer material are performed after the measurement. For example, the positions of the sidewalls of the mandrels are measured and the desired critical dimension of a first set of spacers formed on the sidewalls are increased or decreased, as appropriate, so that the spacers are centered at desired positions for the spacers. By centering the spacers at their desired positions, the pitch of the first set of spacers can be made more regular. The mandrels can then be removed and the spacers are used as a second set of mandrels around which a second set of spacers are formed. The second set of spacers is formed having a desired pitch by modifying the critical dimensions originally desired for these spacers based upon the position of the original mandrels and the critical dimensions of the first set of spacers. The actual critical dimensions of the second set of spacers are selected so that those spacers are also centered at their desired positions. It will be appreciated that the actual CD's of the various sets of spacers are preferably approximately equal to the deposited thickness of the spacer layers from which the spacers are preferably formed, as discussed below.

To form even smaller features, the first set of spacers can be removed and a third set of spacers can be formed using the second set of spacers as mandrels. These cycles of forming and removing spacers can be repeated as desired to form spacers with increasingly smaller pitches.

Advantageously, forming relatively large mandrels can decrease the margin of error stemming from the photolithographic processes used to define those mandrels. The initial lithography step preferably produces features (that will later define the mandrels) that are at least about 150% and, more preferably, at least about 200% the size of the smallest feature formed using a particular lithography system or formed in a single lithography step. In some cases, where different lithography systems may be used to form features on the same substrate, the initial lithography step produces features (to define the mandrels) that are at least about 150% and, more preferably, at least about 200% the size of the smallest lithography-defined, non-pitch multiplied feature of an integrated circuit. For example, memory arrays may include pitch multiplied elements, whereas logic circuits may employ lithography without pitch multiplication to form relatively small features.

Moreover, advantageously, measuring the positions of the mandrels and forming two or more sets of spacers allows a properly centered second set of mandrels, e.g., the first set of spacers, to be formed. Knowledge of the positions of the first set of mandrels and of the critical dimensions of the earlier formed spacers allows subsequent spacers to be more precisely formed having a desired, uniform pitch. Thus, variations in the pitch of spacers formed on a semiconductor substrate can be decreased.

Reference will now be made to the Figures, wherein like numerals refer to like parts throughout. It will be appreciated that the Figures are not necessarily drawn to scale.

Initially, a sequence of layers of materials is formed to allow formation of the spacers over a substrate.

Figure 2:
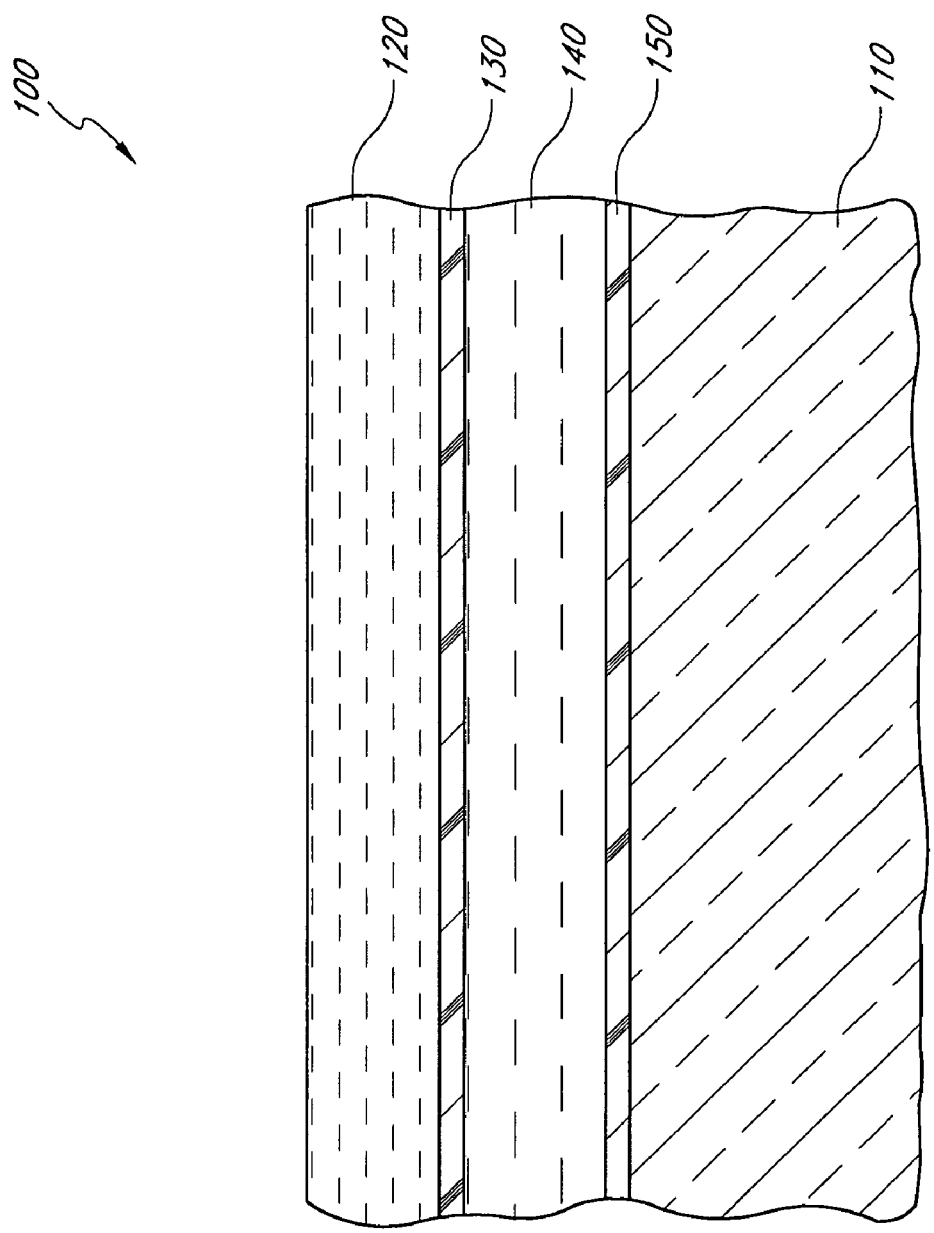
FIG. 2 is a schematic cross-sectional side view of a partially formed integrated circuit, in accordance with preferred embodiments of the invention.

FIG. 2 shows a cross-sectional side view of a partially formed integrated circuit 100. While the preferred embodiments can be used to form any integrated circuit, they are particularly advantageously applied to form devices having regular arrays of electrical devices, including memory cell arrays for volatile and non-volatile memory devices such as DRAM, ROM or flash memory, including NAND flash memory. Consequently, the integrated circuit 100 can preferably be a memory chip or a logic array or processor with embedded memory or a gate array.

With continued reference to FIG. 2, various masking layers 120-150 are preferably provided above a substrate 110. The layers 120-150 will be etched to form a mask for patterning the substrate 110, as discussed below. The materials for the layers 120-150 overlying the substrate 110 are preferably chosen based upon consideration of the chemistry and process conditions for the various pattern forming and pattern transferring steps discussed herein. Because the layers between a topmost selectively definable layer 120 and the substrate 110 preferably function to transfer a pattern derived from the selectively definable layer 120 to the substrate 110, the layers 130-150 between the selectively definable layer 120 and the substrate 110 are preferably chosen so that they can be selectively etched relative to other exposed materials. It will be appreciated that a material is considered selectively, or preferentially, etched when the etch rate for that material is at least about 5 times greater, preferably at least about 10 times greater, more preferably at least about 20 times greater and, most preferably, at least about 40 times greater than that for surrounding materials. Because a goal of the layers 120-150 overlying the substrate 110 is to allow well-defined patterns to be formed in that substrate 110, it will be appreciated that one or more of the layers 120-150 can be omitted or substituted if suitable other materials, chemistries and/or process conditions are used. For example, the layer 130 can be omitted in some embodiments where the resolution enhancement properties of that layer, as discussed below, are not desired. In other embodiments, discussed further below, additional masking layers can be added between the layer 150 and the substrate 110 to form a mask having improved etch selectivity relative to the substrate 110. Exemplary materials for the various layers discussed herein include silicon oxide, silicon nitride, silicon, amorphous carbon, dielectric antireflective coatings (DARC, silicon rich silicon oxynitride), and organic bottom antireflective coatings (BARC), each of which can be selectively etched relative to at least 2 or 3 of the other materials, depending upon the application.

In addition to selecting appropriate materials for the various layers, the thicknesses of the layers 120-150 are preferably chosen depending upon compatibility with the etch chemistries and process conditions described herein. For example, when transferring a pattern from an overlying layer to an underlying layer by selectively etching the underlying layer, materials from both layers are removed to some degree. Preferably, the upper layer is thick enough so that it is not worn away over the course of the pattern transfer.

The selectively definable layer 120 overlies a first hard mask, or etch stop, layer 130, which overlies a temporary layer 140, which overlies a second hard mask, or etch stop, layer 150, which overlies the substrate 110 to be processed (e.g., etched) through a mask. The selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems, extreme ultraviolet systems (including 13.7 nm systems) or electron beam lithographic systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the first hard mask layer 130 preferably comprises an inorganic material. Exemplary materials include silicon oxide ($SiO_2$), silicon or a dielectric anti-reflective coating (DARC), such as a silicon-rich silicon oxynitride. Preferably, the first hard mask layer 130 is a dielectric anti-reflective coating (DARC). Advantageously, the DARCs can enhance resolution by minimizing light reflections, thus increasing the precision with which photolithography can define the edges of a pattern. Optionally, where the resolution enhancement properties of a DARC is not necessary (especially where the features formed by lithography are well within the resolution limits of the lithography process) and where suitable etch selectivities are available, the layer 130 can be omitted and patterns can be transferred directly from the selectively definable layer 120 to the temporary layer 140.

With continued reference to FIG. 2, the temporary layer 140 is preferably formed of amorphous carbon, which, as noted above, offers very high etch selectivity relative to the preferred hard mask materials. More preferably, the amorphous carbon is a form of amorphous carbon that is highly transparent to light and that offers further improvements for photo alignment by being transparent to the wavelengths of light used for such alignment. Deposition techniques for forming such transparent carbon can be found in A. Helmbold, D. Meissner, Thin Solid Films, 283 (1996) 196-203, the entire disclosure of which is incorporated herein by reference.

Figure 12:
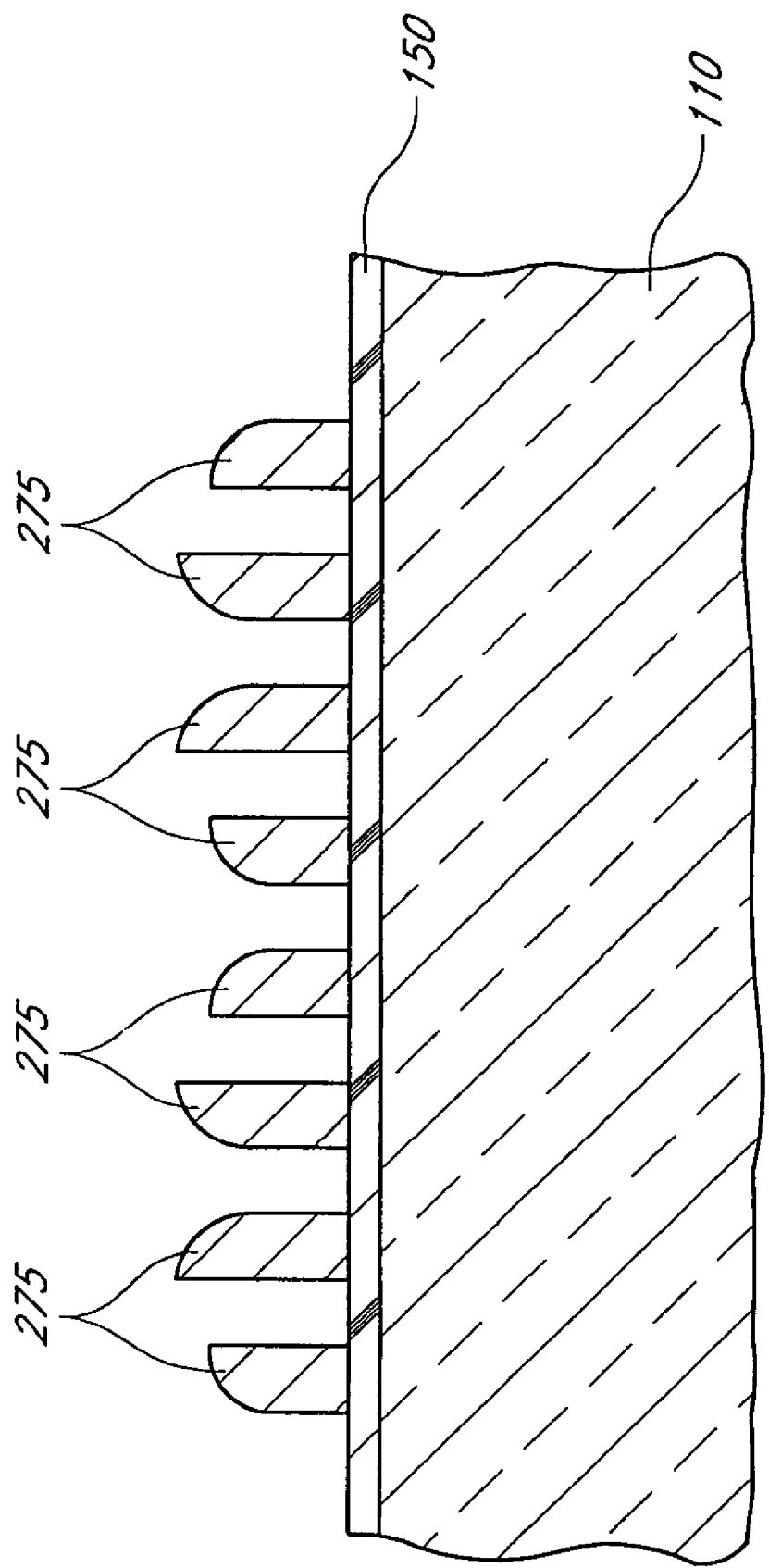
FIG. 12 is a schematic, cross-sectional side view of the partially formed integrated circuit of FIG. 11 after selectively removing the first spacer material, in accordance with preferred embodiments of the invention.
Figure 13:
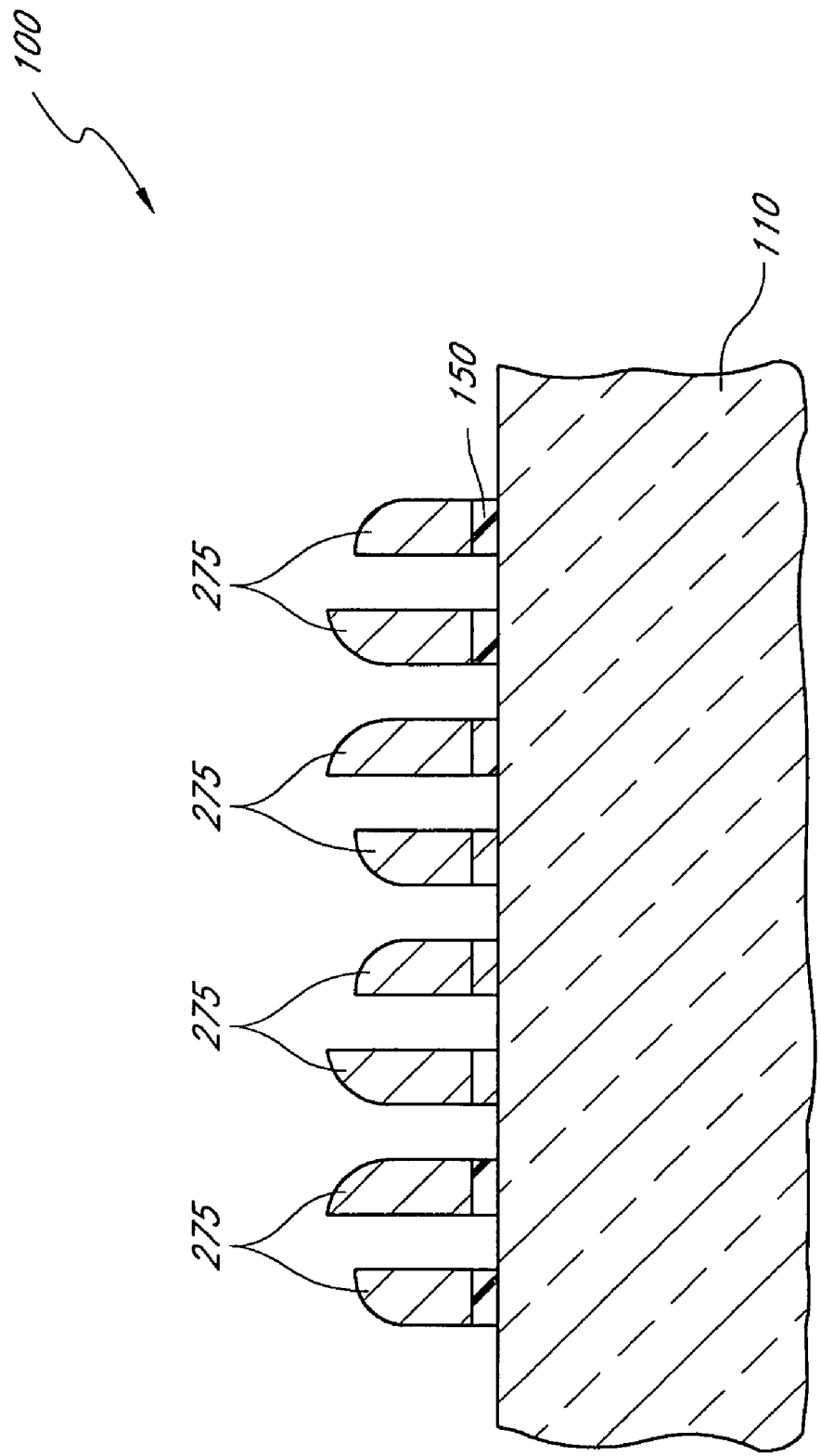
FIG. 13 is a schematic, cross-sectional side view of the partially formed integrated circuit of FIG. 12 after transferring a pattern formed by the second set of spacers to a hard mask layer underlying the spacers, in accordance with preferred embodiments of the invention.

The material for the second hard mask layer 150 is preferably chosen based upon the material used for the spacers 175 and 275 (FIGS. 8 and 12) and for the underlying substrate 110. Examples of materials for the second hard mask layer 150 include a dielectric anti-reflective coating (DARC) (e.g., a silicon oxynitride), silicon or aluminum oxide ($Al_2O_3$). For example, where the spacers 275 are formed of silicon oxide, the hard mask layer 150 can be formed of silicon nitride. In another example, where the substrate 110 is formed of silicon oxide, the spacers 275 can be formed of silicon nitride, the spacers 175 can be formed of silicon oxide and the hard mask layer 150 can be formed of amorphous silicon or polysilicon. In addition, a bottom anti-reflective coating (BARC) (not shown) can optionally be used to control light reflections. In the illustrated embodiment, where the layer 150 is used as a mask to etch the substrate 110, the layer 150 is preferably formed of a material that is resistant to processing (e.g., etching, doping, oxidizing, etc.) of the substrate 110 and can be selectively etched relative to the spacers 275 (FIG. 12). In the illustrated embodiment, the second hard mask layer 150 comprises aluminum oxide, which can be used as a mask for patterning a variety of silicon-containing materials.

The various layers discussed herein can be formed by various methods known in the art. For example, spin-on-coating processes can be used to form photodefinable layers, BARC, and spin-on dielectric oxide layers. Various vapor deposition processes, such as chemical vapor deposition, can be used to form hard mask layers.

Having formed a desired stack of layers, a pattern of spacers is next formed by pitch multiplication.

Figure 3:
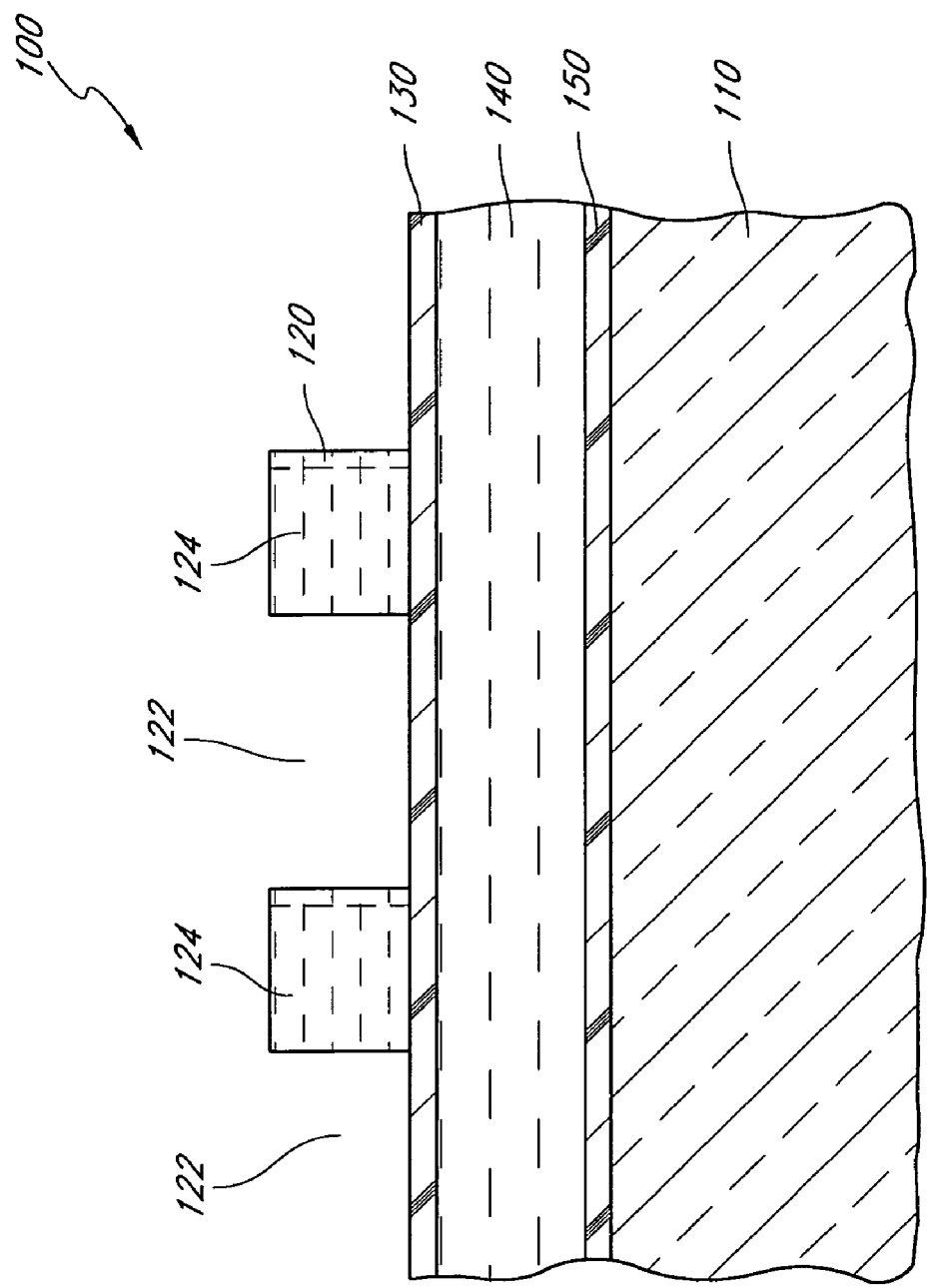
FIG. 3 is a schematic cross-sectional side view of the partially formed integrated circuit of FIG. 2 after forming lines in a photoresist layer, in accordance with preferred embodiments of the invention.

With reference to FIG. 3, a pattern comprising spaces or trenches 122, which are delimited by features 124 formed of photodefinable material, is formed in the photodefinable layer 120. The trenches 122 can be formed by, e.g., photolithography with 248 nm or 193 nm light, in which the layer 120 is exposed to radiation through a reticle and then developed. After being developed, the remaining photodefined material form mask features such as the illustrated lines 124 (shown in cross-section only).

It will appreciated that the CD of the features 124 are chosen to pattern mandrels 145 (FIG. 5) of a desired size. Generally, the size of the mandrels 145 will be chosen based upon the desired degree of pitch multiplication, n. Preferably, the width, $m_w$, of the mandrels 145 is defined by the following relationship:

$m_w=(1-1/n)F$, where $F$ is defined as half the average pitch of the mandrels.

In addition, the spacing, $m_s$, of the mandrels 145 is defined by the following relationship:

$m_s=(1+1/n)F$.

Because the critical dimensions of the features 124 correspond to the critical dimensions of later-formed mandrels 145 and because the pitch of the features will be more than doubled, the mandrels 145 and, thus, the lines 124 can be formed wider than they would be if the pitch were only doubled. By reducing the burdens on the resolution of the lithography system used to define features 124, the lithography system can advantageously be selected and set to maximize precision in defining features 124, rather than to form the smallest features possible. Preferably, the lithography system is not pushed near its resolution limits to define the features 124. For example, rather than forming features 124 with a pitch of about 100 nm to form spacers with a pitch of about 50 nm, the features 124 can be formed with a pitch of about 200 nm or more to form spacers with a pitch of about 50 mm.

Preferably, the CD's of the features 124 are at least about 150% and, more preferably, at least about 200% larger than the CD of the smallest photolithographically-defined feature in an integrated circuit. It will be appreciated that the relatively large features 124 may be used to form interconnects or other repeating features in a memory array, where high density is important, while smaller features can be formed in the outlying logic circuitry, where such density is less critical. The features 124 and the smallest features can be formed using the same photolithography system at the same or different lithography step, or using different photolithography systems, e.g., with each system optimized for forming each set of features. For example, 248 nm light rather than 193 nm light may be used to pattern the features 124, with advantages for manufacturing economics and increased precision for defining features due in part to the use of photoresist having better selectivity characteristics when exposed to light and developed. To form the smaller features lower wavelength light may be used.

In addition or alternatively, the CD's of the features 124 are at least about 150% and, more preferably, at least about 200% larger than the minimum definable feature size for the particular lithography system (using the same optics platform and imaging process, including the same resist). For typical masks, such as binary masks, the skilled artisan will appreciate that CD control can be improved when more information or diffraction orders from a mask feature are resolved on a substrate. Larger features allow for more diffraction orders, since diffraction angles for such features are lower, allowing the optics of a system to collect and to resolve more diffraction orders on the substrate. Preferably, the sizes of the features 124 relative to minimum feature sizes, discussed above, allow for more than about two diffraction orders to be imaged on photoresist 120.

Figure 4:
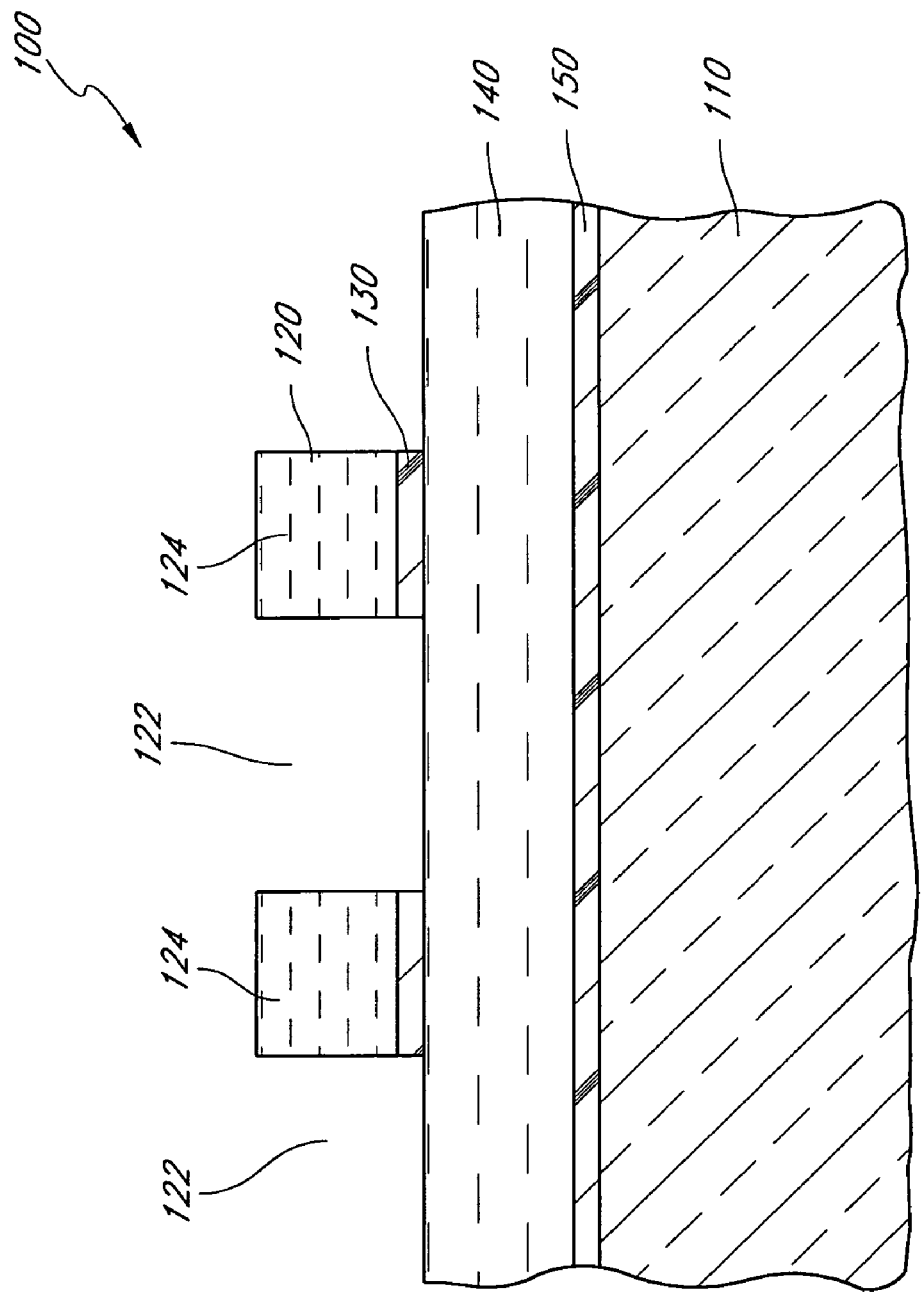
FIG. 4 is a schematic, cross-sectional side view of the partially formed integrated circuit of FIG. 3 after etching through a hard mask layer, in accordance with preferred embodiments of the invention.

With reference to FIG. 4 the pattern in the photodefinable layer 120 is transferred to the hard mask layer 130. This transfer is preferably accomplished using an anisotropic etch, such as an etch using a fluorocarbon plasma, although a wet (isotropic) etch may also be suitable if the hard mask layer 130 is sufficiently thin. Preferred fluorocarbon plasma etch chemistries include $CFH_3$, $CF_2H_2$ and $CF_3H$.

Figure 5:
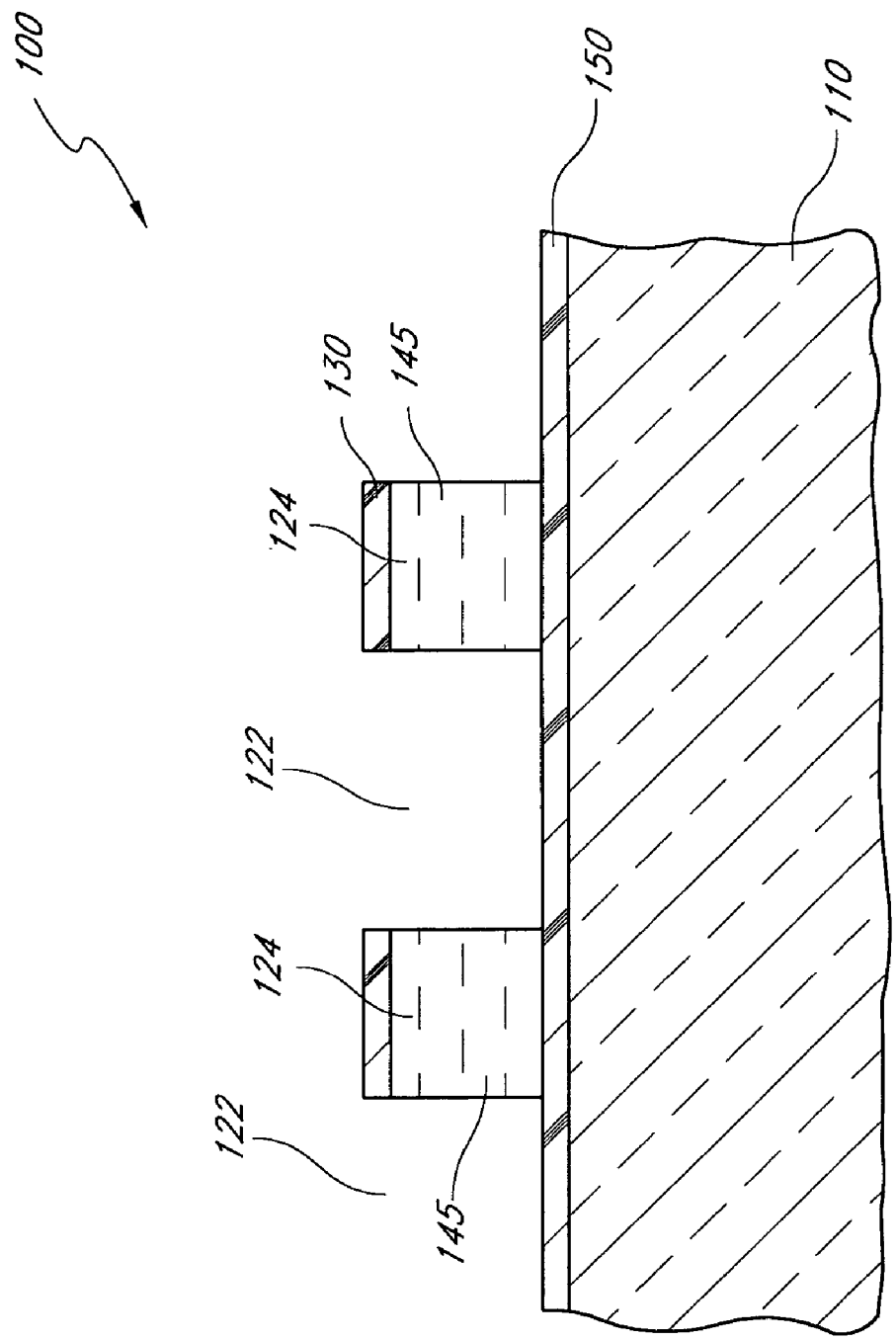
FIG. 5 is a schematic, cross-sectional side view of the partially formed integrated circuit of FIG. 4 after transferring a pattern from the hard mask layer to a temporary layer to form a pattern of mandrels in the temporary layer, in accordance with preferred embodiments of the invention.

With reference to FIG. 5, the pattern in the photodefinable layer 120 and the hard mask layer 130 is transferred to the temporary layer 140 to form mandrels 145 (FIG. 5). It has been found that the temperatures used for spacer material deposition (which is preferably conformal, such that processes such as chemical vapor deposition are preferred) are typically too high for photoresist to withstand. Thus, the pattern is preferably transferred from the photodefinable layer 120 to the temporary layer 140, which is formed of a material that can withstand the process conditions for spacer material deposition and etching, discussed below. In addition to having higher heat resistance than photoresist, the material forming the temporary layer 140 is preferably selected such that it can be selectively removed relative to the material for the spacers 175 (FIG. 9) and the underlying etch stop layer 150. As noted above, the layer 140 is preferably formed of amorphous carbon and, more preferably, transparent carbon.

The pattern in the photodefinable layer 120 is preferably transferred to the temporary layer 140 using a reactive ion etch (RIE) employing an oxygen-containing plasma, e.g., a plasma containing $SO_2$, $O_2$ and Ar. Other suitable etch chemistries include a $Cl_2/O_2/SiCl_4$, $SiCl_4/O_2/N_2$, or $HBr/O_2/N_2/SiCl_4$-containing plasma. Advantageously, the $SO_2$-containing plasma is used as it can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al., filed Aug. 31, 2004, the entire disclosure of which is incorporate herein by reference. It will be appreciated that the $SO_2$-containing plasma can simultaneously etch the temporary layer 140 and also remove the photoresist layer 120. The resulting lines 124, separated by spaces 122, constitute the placeholders or mandrels along which a pattern of spacers 175 (FIG. 11) will be formed.

Figure 6:
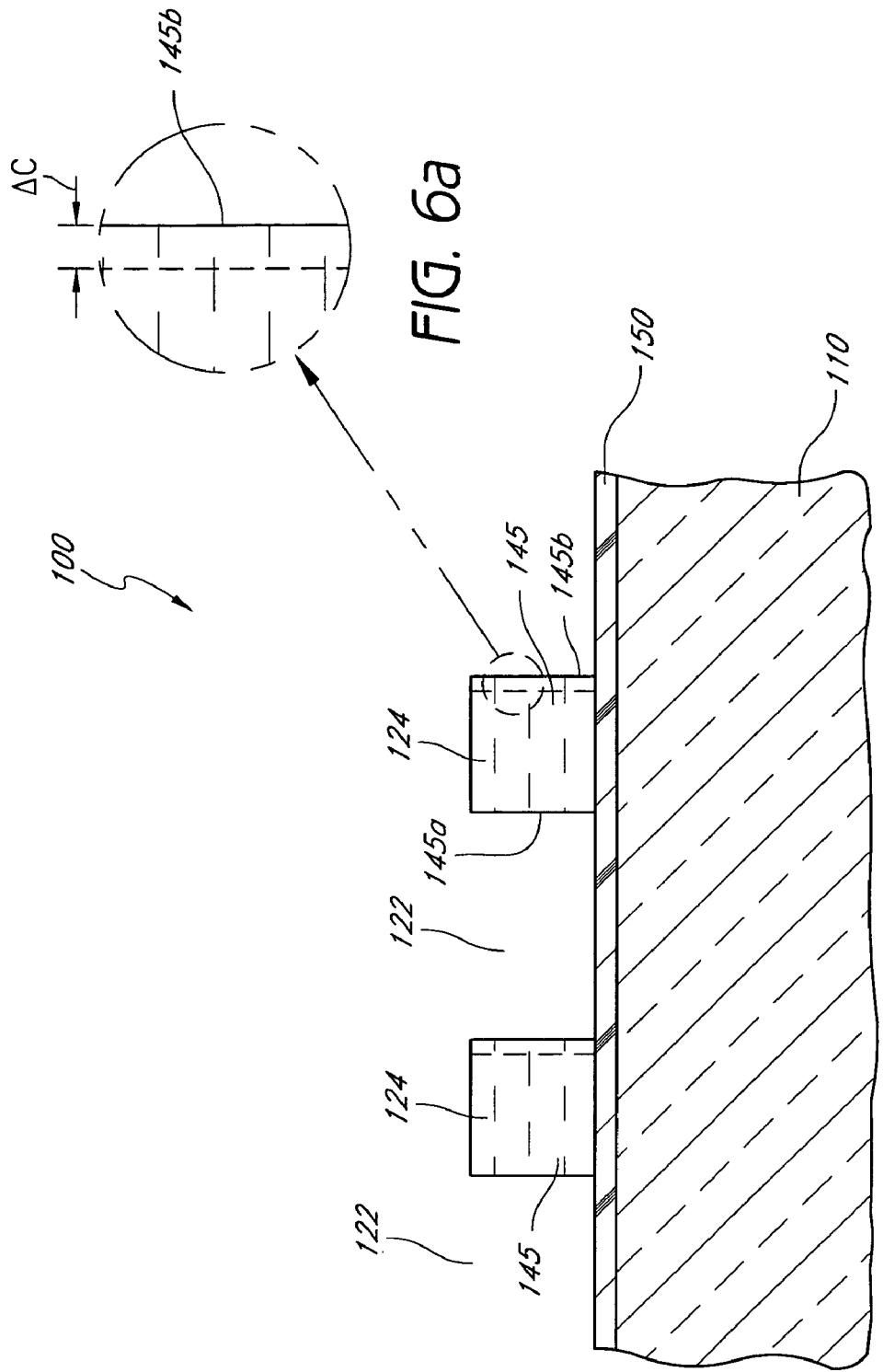
FIG. 6 is a schematic, cross-sectional side views of the partially formed integrated circuit of FIG. 5, after a hard mask layer removal and showing measured errors in mandrel dimensions, in accordance with preferred embodiments of the invention.

The hard mask layer 130 can be selectively removed to facilitate later spacer formation by leaving the mandrels 145 exposed for subsequent etching (FIG. 12). The material of the illustrated hard mask layer 130 can be removed using a buffered oxide etch (BOE), which is a wet etch comprising HF and $NH_4F$. FIGS. 6 and 6a show the partially fabricated integrated circuit 130 after the removal of the layer 130.

In addition to critical dimension errors resulting from the limitations of photolithography, it will be appreciated that the process of transferring the pattern of lines 124 from the photoresist layer 120 to hard mask layer 130 and then to the temporary layer 140 can also cause deviations in the dimensions of the mandrels 145. For example, local differences in temperatures can result in local differences in etch rates, which can cause some parts of the layers 130 and/or 140 to be etched at different rates. Thus, due to these and other possible causes of error, the actual critical dimension of the mandrels 145 can vary by an average amount $\Delta C$, over a substrate, from the critical dimension (shown in dotted lines) that is desired of these features.

Preferably, after removing the hard mask layer 130, the positions of sidewalls 145a and 145b and/or the critical dimensions of the mandrels 145 are measured. It will be appreciated that the positions of the sidewalls 145a and 145b can be measured directly, or their relative positions can be determined by measuring the critical dimensions of the mandrels 145. The mandrel measurement can be performed using various metrology tools and measurement techniques known in the art. For example, scatterometry is preferably used to perform the measurements. Other examples of suitable measurement techniques in include utilizing a CD-SEM (scanning electron microscope) and AFM (Atomic Force Microscope). As discussed below, these measurements will help to more precisely center and place later formed spacers 175 and 275 (FIGS. 8 and 11), advantageously minimizing the wafer to wafer $\Delta C$ for the spacers 175 and 275. It will be appreciated that there exists a $\Delta C$ for features within a single wafer and also for features from wafer to wafer. Because the process steps described herein are preferably performed over at least a region of a wafer and, more preferably, over an entire wafer, they preferably minimize $\Delta C$ for the spacers 175 and 275 from wafer to wafer.

Measurement of the mandrels 145 can be performed after etching the layer 140 and before removing the hard mask layer 130. However, more accurate results can be obtained after removing the layer 130, since the removal process may slightly etch the mandrels 145. In addition, the mandrels 145 can be etched before measuring if a trim etch is desired to reduce the width of the those mandrels 145. Alternatively, the features 124 can be etched before transferring the pattern in the photoresist layer 120 to the temporary layer 140. Advantageously, however, a trim etch is unnecessary and preferably is not performed, since the mandrels 145 can be relatively large.

Figure 7:
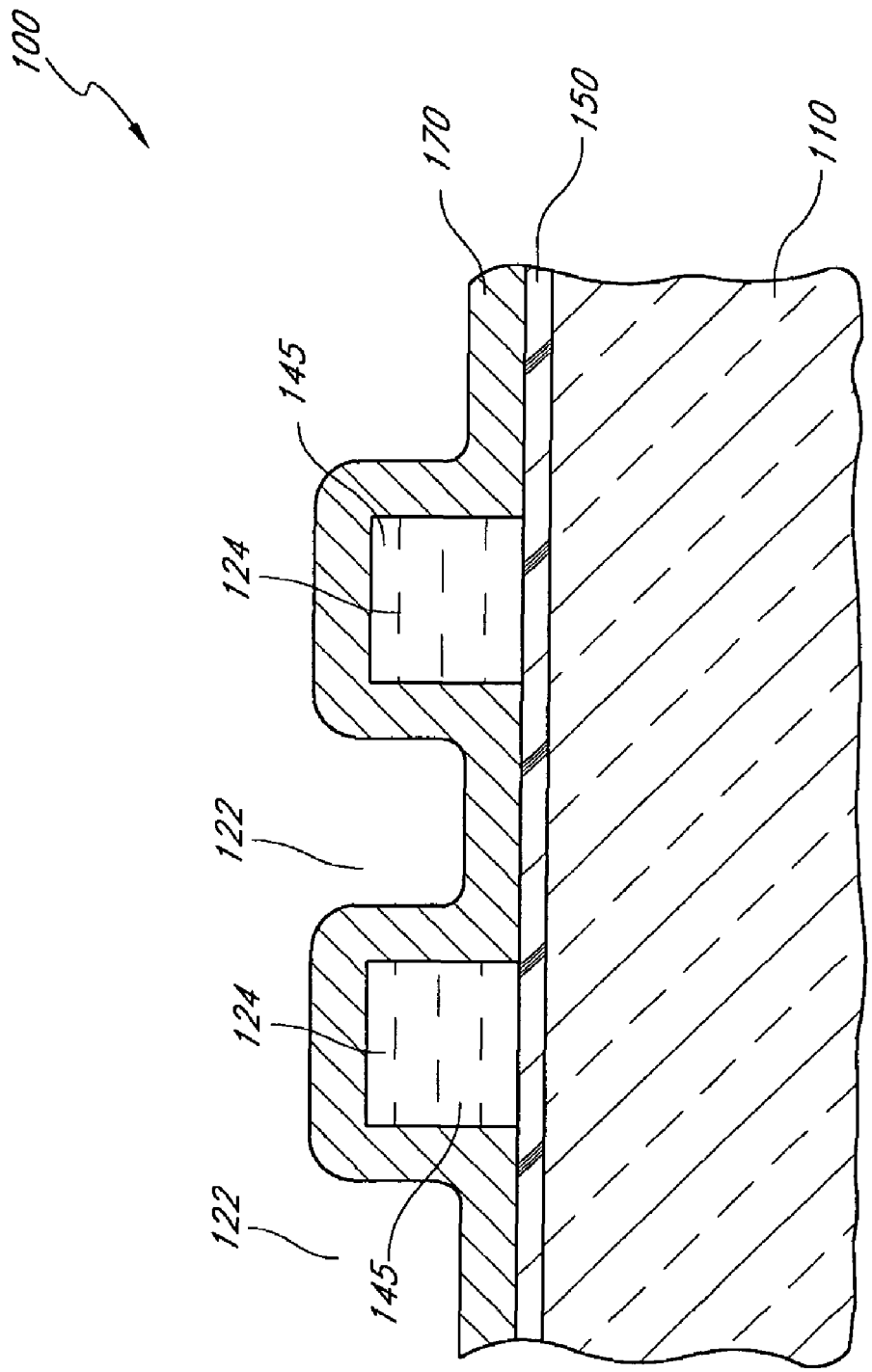
FIG. 7 is a schematic, cross-sectional side view of the partially formed integrated circuit of FIG. 6 after depositing a layer of a first spacer material, in accordance with preferred embodiments of the invention.
Figure 8:
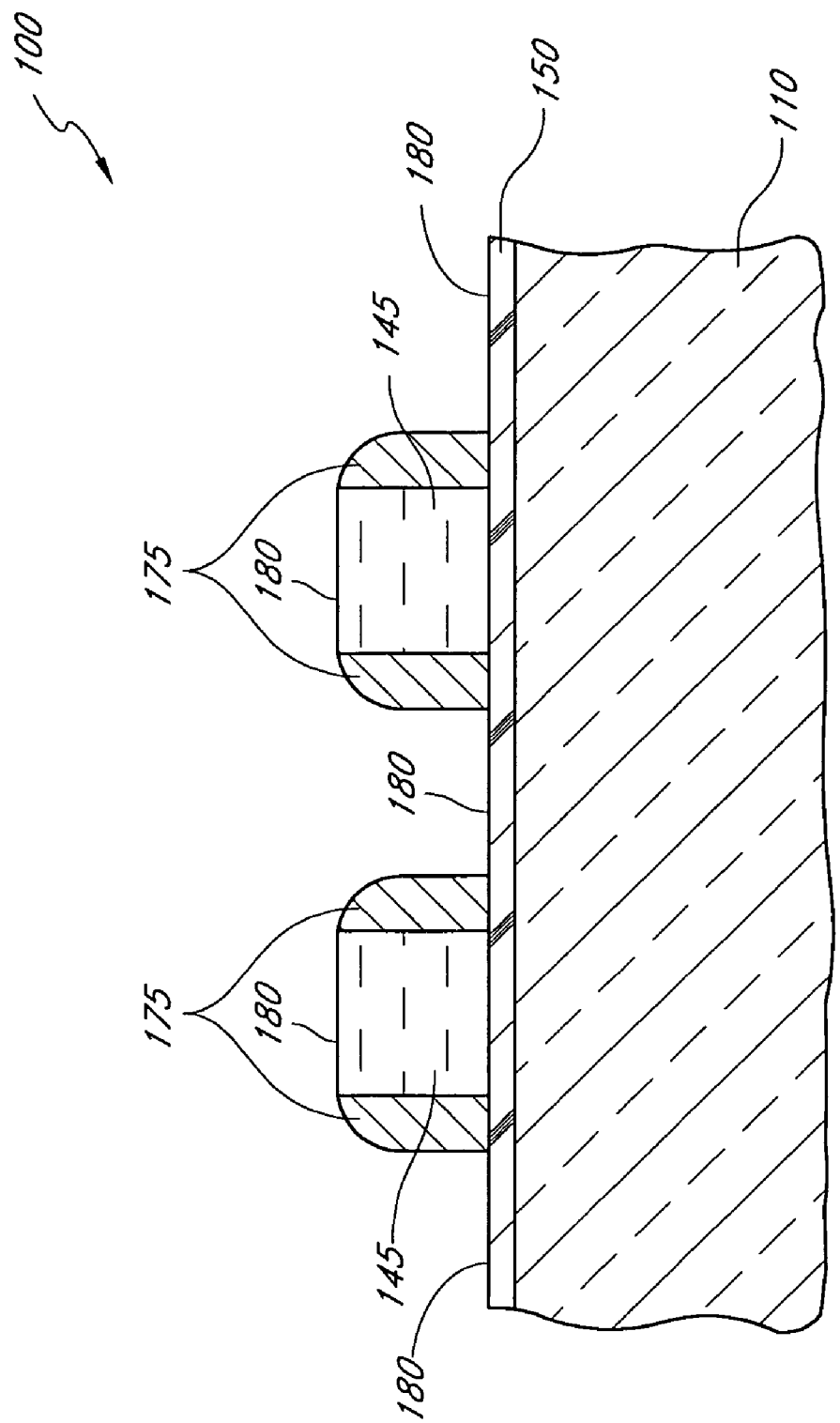
FIG. 8 is a schematic, cross-sectional side view of the partially formed integrated circuit of FIG. 7 after performing a spacer etch to form a first set of spacers, in accordance with preferred embodiments of the invention.

Next, as shown in FIG. 7, a layer 170 of a first spacer material is preferably blanket deposited conformally over exposed surfaces, including the hard mask layer 150 and the tops and sidewalls of the mandrels 145. Preferably, the layer 170 has a thickness that approximately equals the critical dimension of spacers 175 (FIG. 9) formed from the layer 170, taking into account any changes in dimensions that may occur due to subsequent processing steps, such as a spacer etch or mandrel removal. It will be appreciated that the integrated circuit 100 may be designed with spacers 175 centered at desired points in the circuit and having a desired critical dimension which assumes that the mandrels 145 also have particular desired dimensions. As noted above, however, the dimensions of the mandrel 145 can vary from their desired dimensions by $\Delta C$. In the preferred embodiments, the desired critical dimension of the spacers 175 is modified based upon the measured positions of the sidewalls 145a and 145b to account for $\Delta C$. With reference to FIG. 8, the thickness of the layer 170 is selected so that the spacers 175 (FIG. 9) are still centered at their desired positions 185 (FIG. 9), with the separation between the center points of the spacers 175 equal to the desired separation, which is equal to the desired pitch for the spacers 175.

For example, as above, the average pitch of the mandrels 145 can be defined as about 2F. In a case where a goal is to have the centers of spacers 175 (FIG. 9) at a separation distance of x (e.g., 1F) from one another and to form spacers 175 ideally having a critical dimension, $t_1$ (e.g., ¼ F), the mandrels 145 ideally have a critical dimension of $x-t_1$ (¾ F). In actuality, however, the critical dimension of the mandrels 145 can vary by $\Delta C$, as discussed above with reference to FIGS. 6 and 6a. To account for this variation and to keep the spacers 175 properly centered, the corrected thickness of the spacers 175 is about $t_{c1}$, where $t_{c1}$ is given by the following relationship:

$t_{c1} = t_1 - \Delta C$, where $t_1 > |\Delta C|$.

More generally:

$t_{c1} = F/n - \Delta C$, where $n$ is the degree of pitch multiplication desired.

Thus, the layer 170 is deposited to a thickness sufficient to form spacers 175 having a critical dimension of about $t_{c1}$.

In addition, the material forming the spacers 175 or subsequently formed spacers preferably: 1) can be deposited with good step coverage; 2) can be deposited at temperatures compatible with other materials in the substrate and the masking stack (including the mandrels 145, which can be sensitive to temperatures above about 500° C. if they are formed of amorphous carbon); and 3) can be selectively etched relative to materials on which the spacer material is deposited. In the illustrated embodiment, the first spacer material 170 preferably can be selectively etched relative to the mandrels 145, the underlying hard mask layer 150 and the second set of spacers 275 (FIG. 12). Preferred materials include silicon, silicon oxides and silicon nitrides. In the illustrated embodiment, the spacer material is a conformal silicon nitride, which provides particular advantages in combination with other selected materials of the masking stack.

Figure 9:
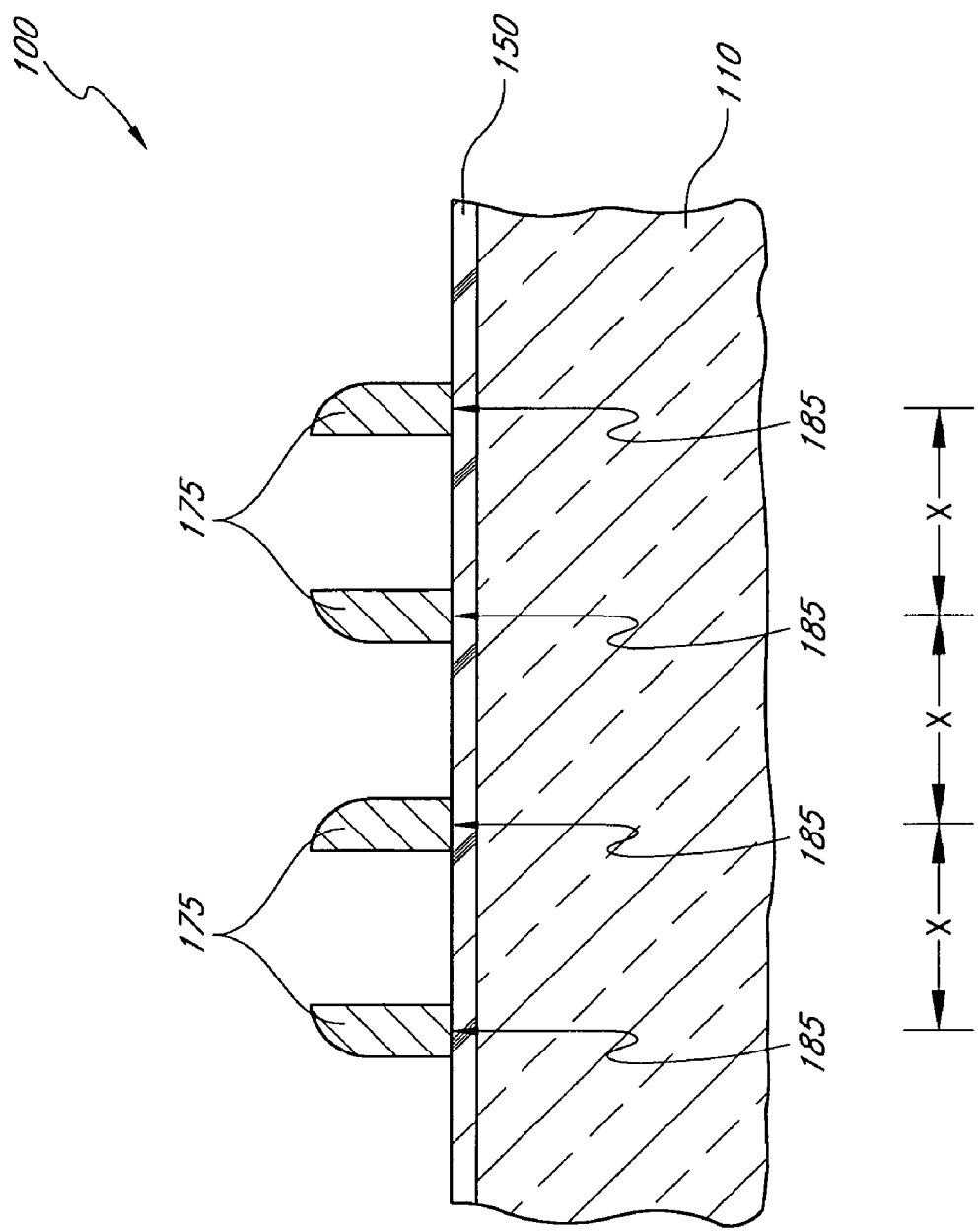
FIG. 9 is a schematic, cross-sectional side view of the partially formed integrated circuit of FIG. 8 after selectively removing mandrels, in accordance with preferred embodiments of the invention.

It will be appreciated that the spacer material deposition can be accomplished by various deposition methods known in the art, including chemical vapor deposition. Where the spacer material is silicon nitride and the mandrels 145 comprises amorphous carbon, the spacer material is preferably deposited by atomic layer deposition, which has advantages for forming exceptionally conformal layers at relatively low temperatures compatible with amorphous carbon. The thickness of the layer 170 is preferably determined based upon the desired width of the spacers 175 (FIG. 9). Preferably, the step coverage is about 80% or greater and, more preferably, about 90% or greater.

With reference to FIG. 8, the silicon nitride spacer layer 170 is then subjected to an anisotropic etch to remove spacer material from horizontal surfaces 180 of the partially formed integrated circuit 100. Such a directional etch, also known as a spacer etch, can be performed using, e.g., a $CF_4$, $CHF_3$ and/or $NF_3$-containing plasma.

With reference to FIG. 9, the remaining temporary layer 140 (i.e., mandrels 145) is next selectively removed to leave freestanding spacers 175. The removal can be accomplished using an organic strip process. Preferred etch chemistries include an oxygen-containing plasma etch, such as an etch using $SO_2$.

Thus, one cycle of pitch multiplication has been accomplished. Advantageously, by measuring the mandrels 145 and appropriately selecting the critical dimensions of the spacers 175, the spacers 175 are centered at their desired positions 185 and are "on pitch." In the illustrated embodiment, the pitch of the spacers 175 is roughly half that of the photoresist lines 124 and spaces 122 (FIG. 3) originally formed by photolithography. Where the photoresist lines 124 had a pitch of about 200 nm, spacers 175 having a pitch of about 100 nm or less can be formed. It will be appreciated that because the spacers 175 are formed on the sidewalls of the features or lines 124, the spacers 175 generally follow the outline of the pattern of features or lines 124 in the photodefinable layer 120 and, so, typically form a closed loop around isolated mandrels or lining inner surfaces of mandrel-surrounded voids in the spaces 122 between the lines 124.

Next, the spacers 175 are used as a second set of properly centered mandrels in another cycle of pitch multiplication.

Figure 10:
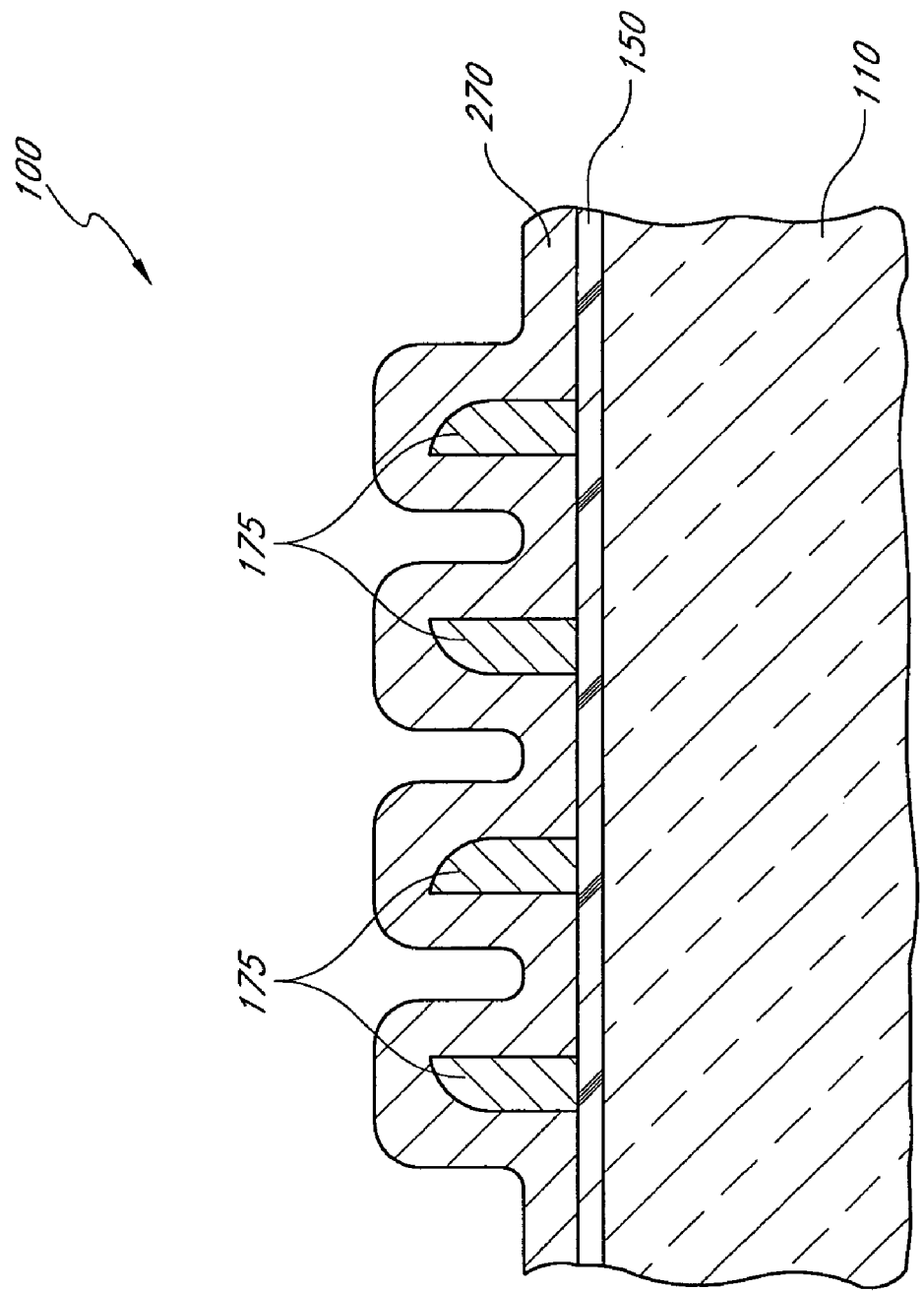
FIG. 10 is a schematic, cross-sectional side view of the partially formed integrated circuit of FIG. 9 after depositing a layer of a second spacer material, in accordance with preferred embodiments of the invention.

With reference to FIG. 10, a blanket layer 270 of a second spacer material is deposited. So that the spacers 275 (FIG. 11) formed from the layer 270 are formed on pitch, the thickness of the layer 270 is determined with reference to the measurement of the mandrel 145 discussed above. It will be appreciated that the manufacture of the integrated circuit 100 is conceived with the spacers 275 having a desired CD of $t_2$. This desired CD is modified so that the CD of the spacers 275 centers them at their desired positions. The CD of the spacers 275 (FIG. 12) is chosen to be about $t_{c2}$, which is determined based upon the following relationship:

$t_{c2} = t_2 + \Delta C$, where $t_2 > |\Delta C|$.

More generally:

$t_{c2} = F/n + \Delta C$, where $n$ is the degree of pitch multiplication desired.

The layer 270 is deposited to a thickness sufficient to form spacers 275 having a critical dimension $t_{c2}$. It will be appreciated that n, which corresponds to the degree of multiplication desired, typically also corresponds to double the number of cycles of spacer layer deposition and spacer etch that are performed. For example, in forming the spacers 175 and 275, two cycles, each comprising a spacer layer deposition and spacer etch, are performed. Thus, n is equal to 4, a pitch quadrupling.

The second spacer material is preferably conformally deposited and chosen to be selectively removable relative to the material forming the spacers 175 and the hard mask layer 150. In the illustrated embodiment, the second spacer material is silicon oxide.

Figure 11:
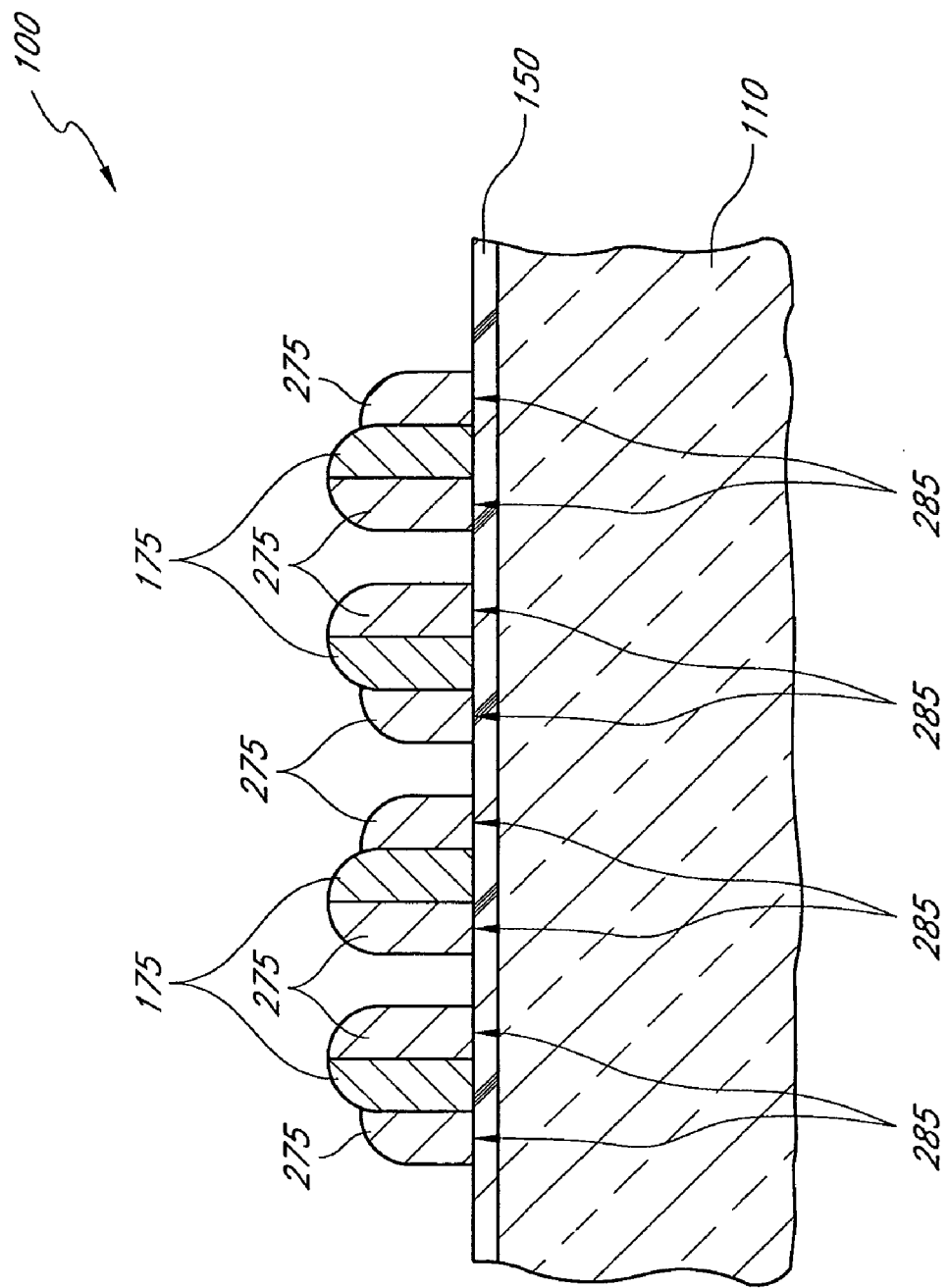
FIG. 11 is a schematic, cross-sectional side view of the partially formed integrated circuit of FIG. 10 after performing a spacer etch selective for the second spacer material to form a second set of spacers, in accordance with preferred embodiments of the invention.

With reference to FIG. 11, the silicon oxide spacer layer 270 is subjected to an anisotropic spacer etch to form spacers 275 around the spacers 175. The spacer etch can be performed using, e.g., a fluorocarbon plasma containing $CF_4/CHF_3$, $C_4F_8/CH_2F_2$ or $CHF_3/Ar$ plasma.

With reference to FIG. 12, the first spacers 175 (i.e., second mandrels) are removed to leave the second set of spacers 275 freestanding. Preferred etch chemistries include dry etches, such as with a $CF_4$, $CHF_3$ and/or $NF_3$-containing plasma, and wet etches, such as a buffered oxide etch.

Thus, a second cycle of pitch multiplication is accomplished. As illustrated, the pitch of the spacers 275 is roughly a quarter that of the originally formed photoresist lines 124 and spaces 122 (FIG. 3). Thus, where the photoresist lines 124 had a pitch of about 200 nm, the spacers 275 have a pitch of about 50 nm.

Figure 14:
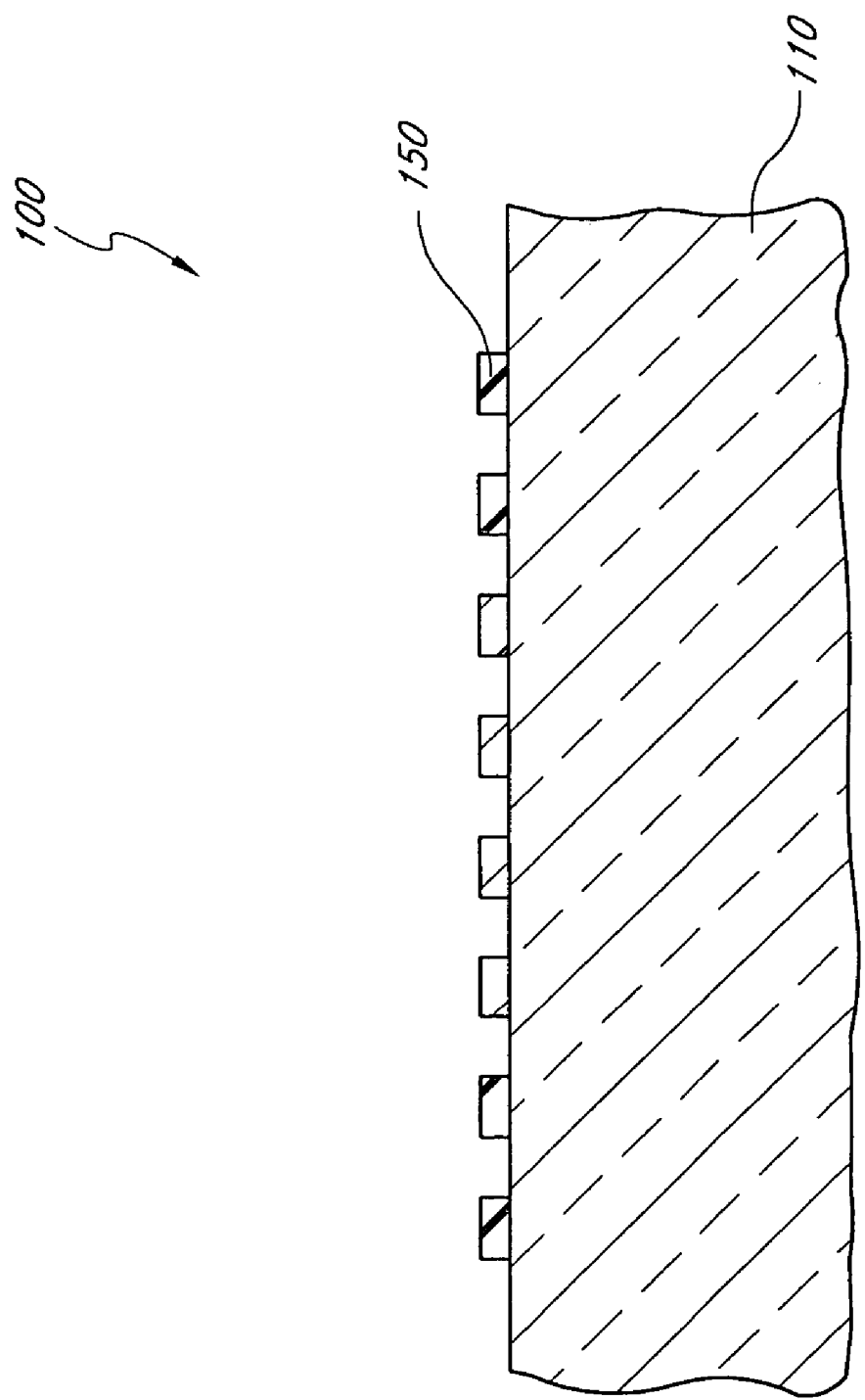
FIG. 14 is a schematic, cross-sectional side view of the partially formed integrated circuit of FIG. 13 after removing the second set of spacers, in accordance with preferred embodiments of the invention.

In some embodiments, particularly where the substrate 110 can be etched with good selectivity relative to the hard mask layer 150, the hard mask layer 150 can be used as a mask to etch the substrate 110. As shown in FIG. 14, the pattern formed by the spacers 275 can be transferred to the hard mask layer 150 using an anisotropic etch, e.g., a $BCl_3/Cl_2$ plasma etch, to selectively etch the substrate 110 through that pattern formed by the spacers 275.

Optionally, the spacers 275 can be removed to reduce the aspect ratio of mask features before etching the substrate 110. For example, where the spacers 275 comprise a silicon oxide, the spacer removal can be accomplished using a wet or dry etch, e.g., a wet buffered oxide etch or a dry etch using a $CH_2F_2/C_4F_8/Ar/O_2$ plasma.

Figure 15:
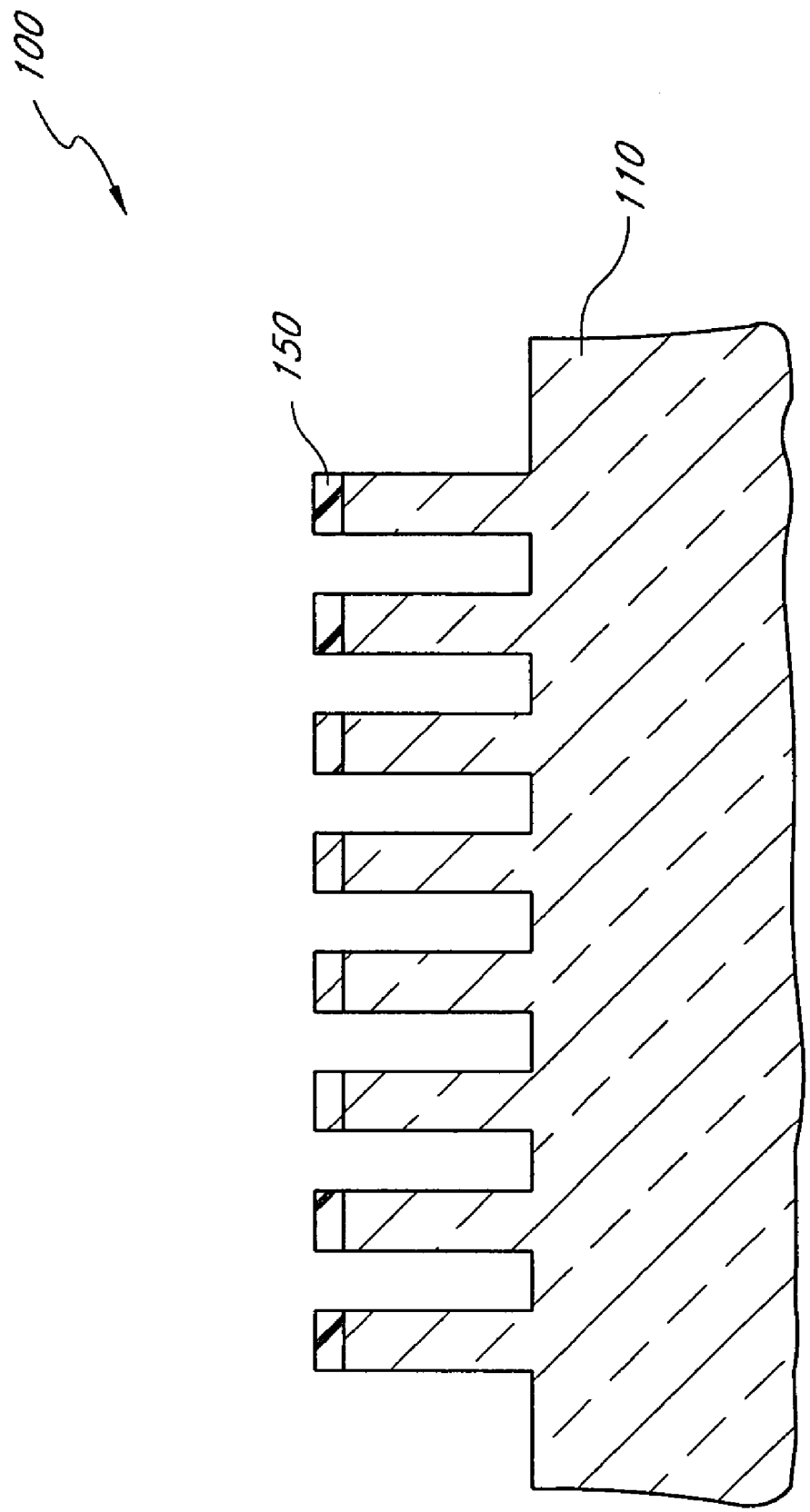
FIG. 15 is a schematic, cross-sectional side view of the partially formed integrated circuit of FIG. 14 after transferring the second spacer pattern to an underlying substrate, in accordance with preferred embodiments of the invention.

With reference to FIG. 14, the hard mask layer 150 and/or the spacers 275 can be used as a mask through which the substrate 110 is processed. For example, with reference to FIG. 15, the pattern in the hard mask 150 can be transferred to the substrate 110 by selectively etching the substrate 110, using an etch chemistry appropriate for the material(s) of the substrate 110, as known in the art.

Figure 16:
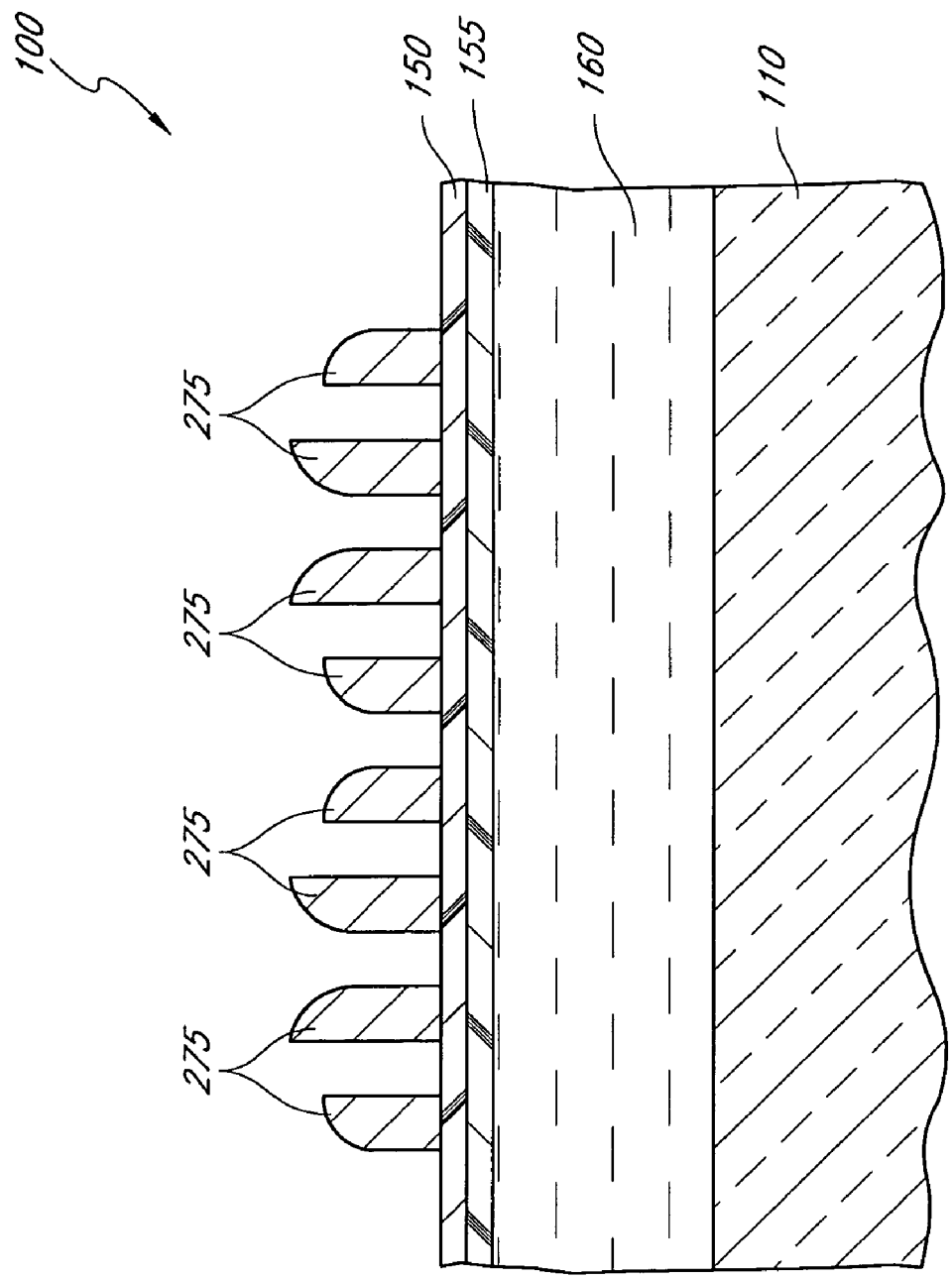
FIG. 16 is a schematic, cross-sectional side view of a partially formed integrated circuit having hard mask and additional masking layers disposed between spacers and the substrate, in accordance with preferred embodiments of the invention.

With reference to FIG. 16, in other embodiments, especially where the substrate 110 is difficult to etch or prolonged processing through the mask is desired, intervening layers of masking material can be formed between the hard mask layer 150 and the substrate 110. For example, additional layers 155 and 160 can be provided, as discussed in co-pending U.S. Patent Provisional Application No. 60/662,323, entitled Pitch Reduced Features Relative to Photolithography Features, filed Mar. 15, 2005, the entire disclosure of which is incorporated herein by reference.

Figure 17:
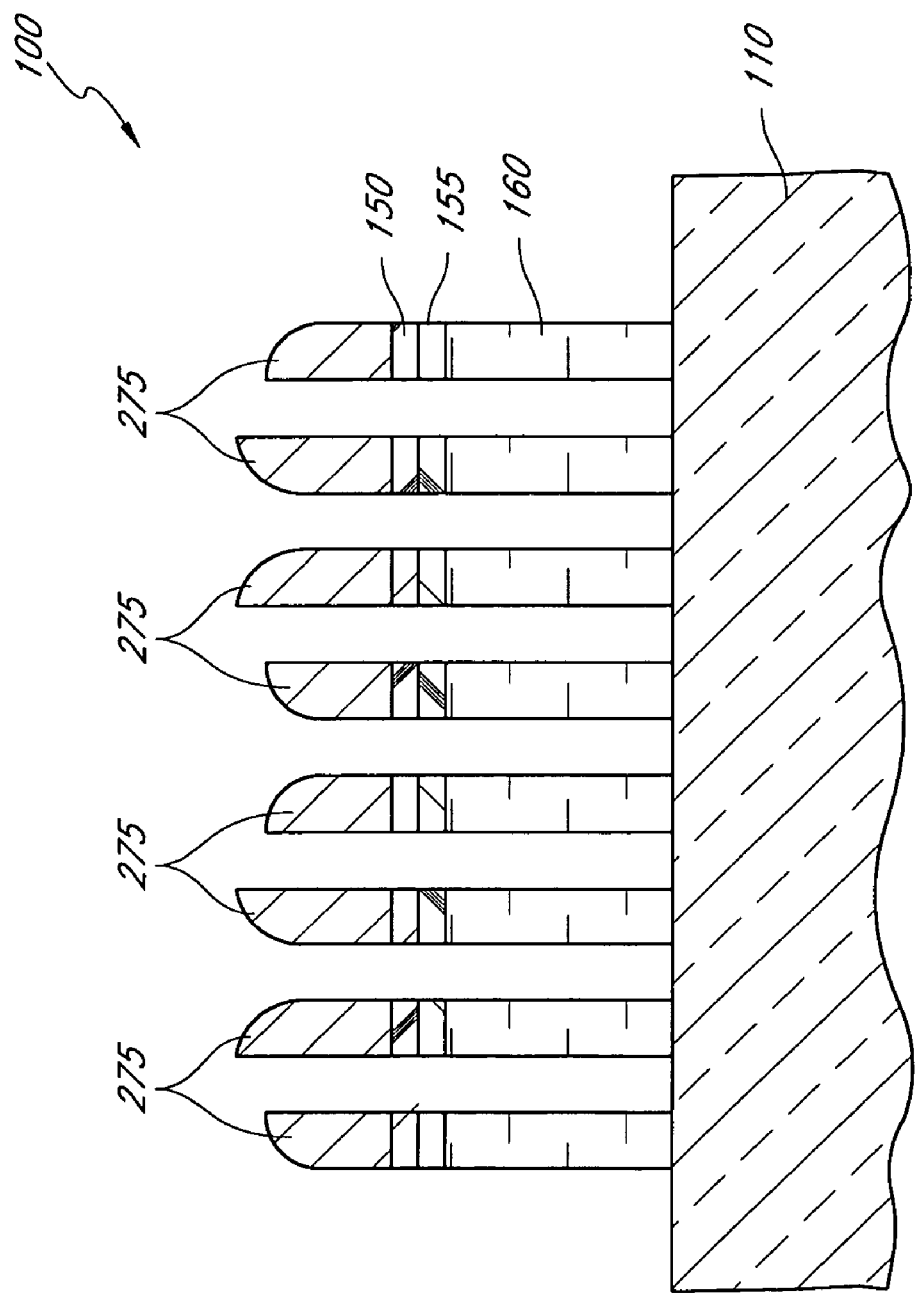
FIG. 17 is a schematic, cross-sectional side view of the partially formed integrated circuit of FIG. 16 after transferring the spacer pattern into the additional masking layers, in accordance with preferred embodiments of the invention.

In such a case, the layer 150 preferably comprises a material that has good etch selectively relative to the spacers 275 and the layer 155. Exemplary materials for the layers 150 and 155 include amorphous silicon and silicon oxide, respectively. The layer 155 advantageously allows for a pattern-cleaning step (e.g., with $O_2$ plasma) to remove any polymerized organic residue that may be present as the result of previous etch processes. After the cleaning step, a well-defined pattern can be transferred to the layer 160. The layer 160 is preferably formed of amorphous carbon, which is advantageously resistant to many etch chemistries for removing silicon materials in the substrate 110. As shown in FIG. 17, the pattern defined by the spacers 275 can be transferred to the layer 160, which then serves as the primary mask for patterning the substrate 110. Advantageously, due to the availability of extreme selectivity when etching amorphous carbon, a patterned hard mask layer 150 can be used after removal of the spacers 275, so that the mask used to transfer the pattern to the primary masking layer 160 has lower and more uniform aspect ratio features.

In addition to a 4× pitch multiplication scheme, more generally, it will be appreciated that n× pitch multiplication is possible, where n≧3. The sizes of mandrels and spacers are appropriately sized, as discussed above, to achieve the desired degree of multiplication. An example of a 6× pitch multiplication scheme is illustrated in FIGS. 18-22.

Figure 18:
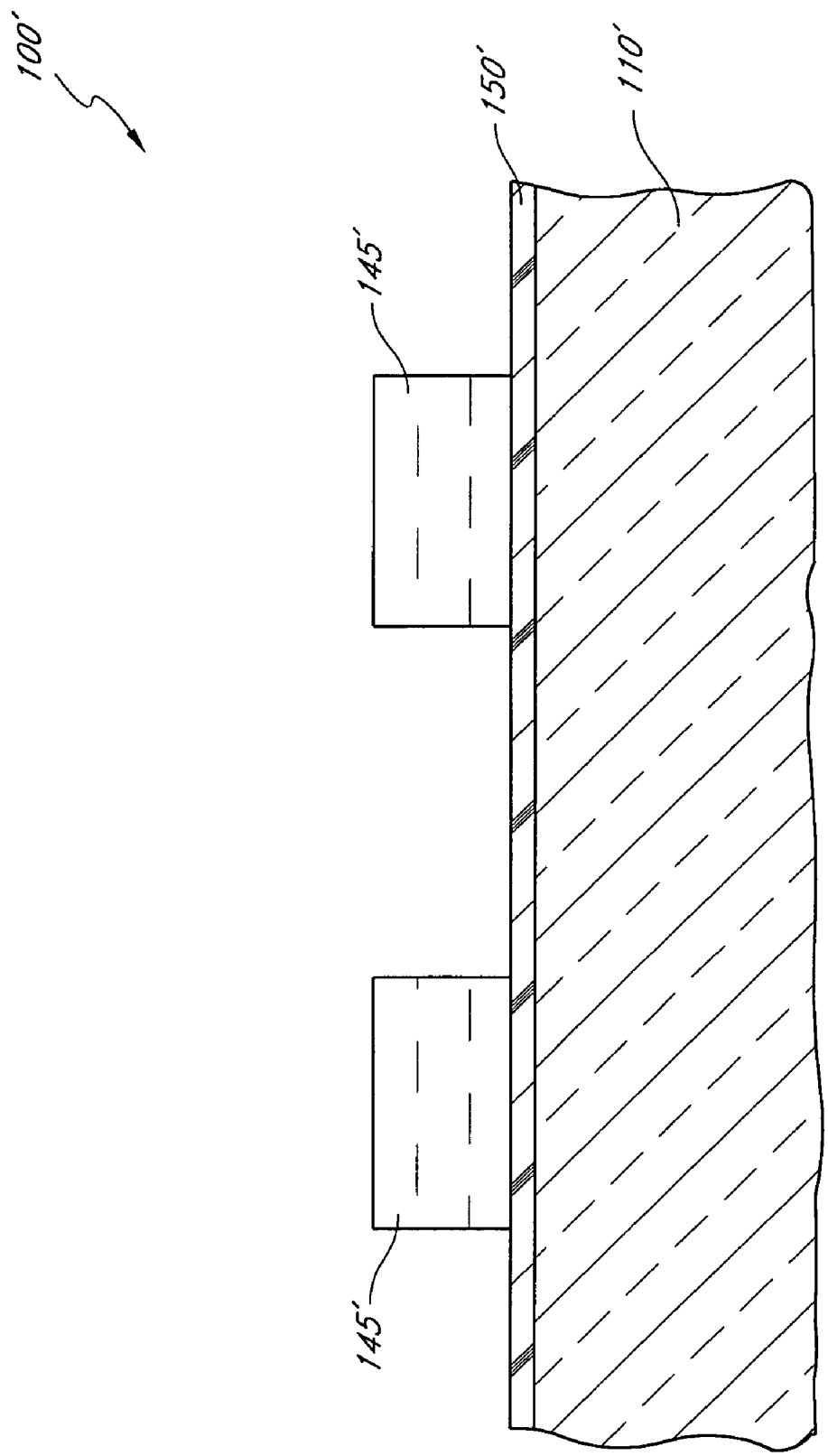
FIG. 18 is a schematic, cross-sectional side view of a partially formed integrated circuit after forming a plurality of mandrels, in accordance with preferred embodiments of the invention.
Figure 19:
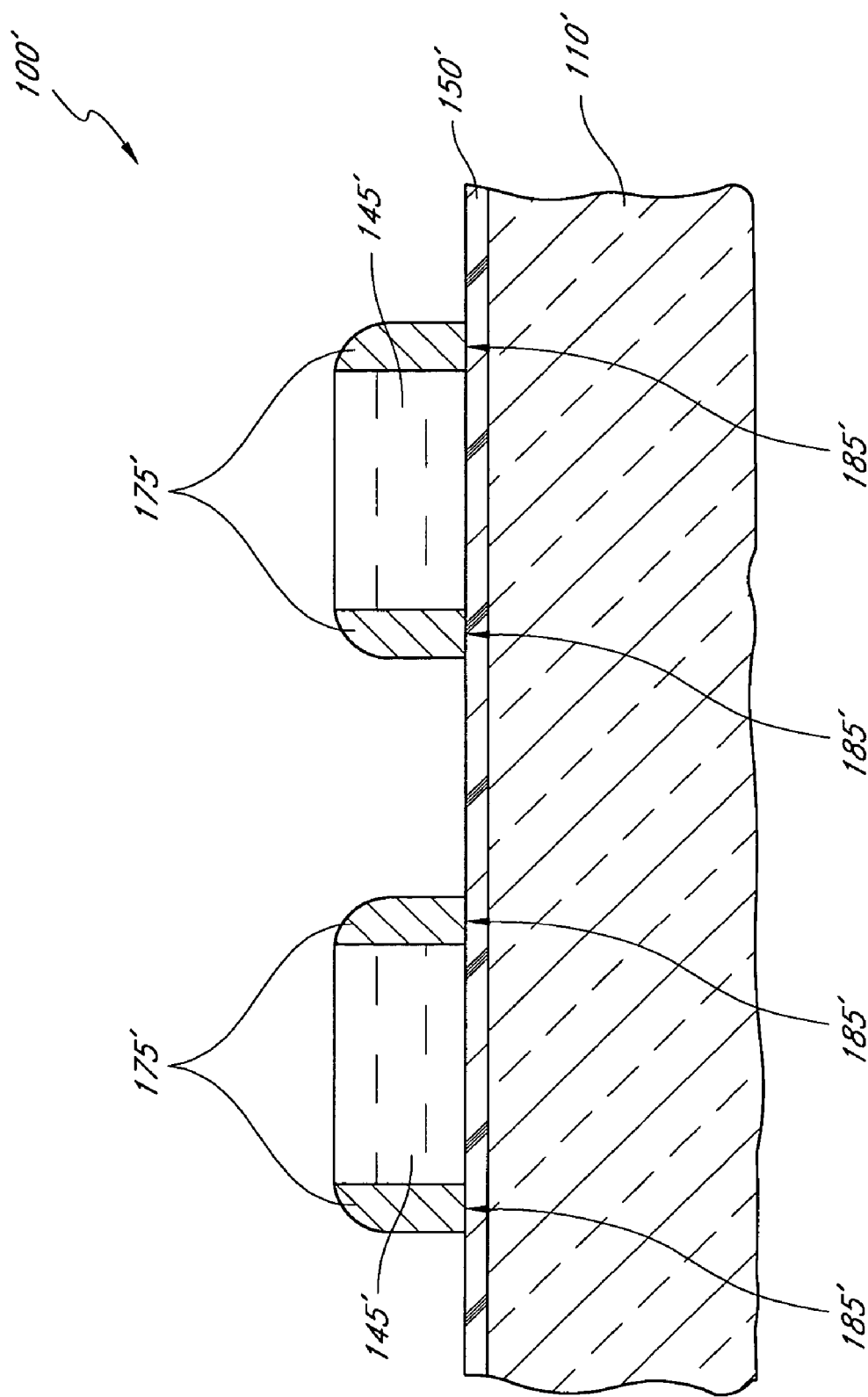
FIG. 19 is a schematic, cross-sectional side view of the partially formed integrated circuit of FIG. 18 after forming a set of spacers formed of a first spacer material around the mandrels, in accordance with preferred embodiments of the invention.

With reference to FIG. 18, a partially fabricated integrated circuit 100' is formed with mandrels 145' overlying hard mask layer 150' and substrate 110'. The mandrels 145' can be formed using the same process to form the mandrels 145 discussed above. The critical dimensions of these mandrels are measured and the spacers 175' are formed with a first spacer material. The spacers 175' have a width chosen to center them at the desired spacer centers 185', as shown in FIG. 19. As above, the spacers 175' are formed by depositing a layer of a first spacer material (not shown) and performing a spacer etch. After forming the spacers 175' the mandrels 145' are removed and the spacers' 175' are used as mandrels for a subsequent spacer formation.

Figure 20:
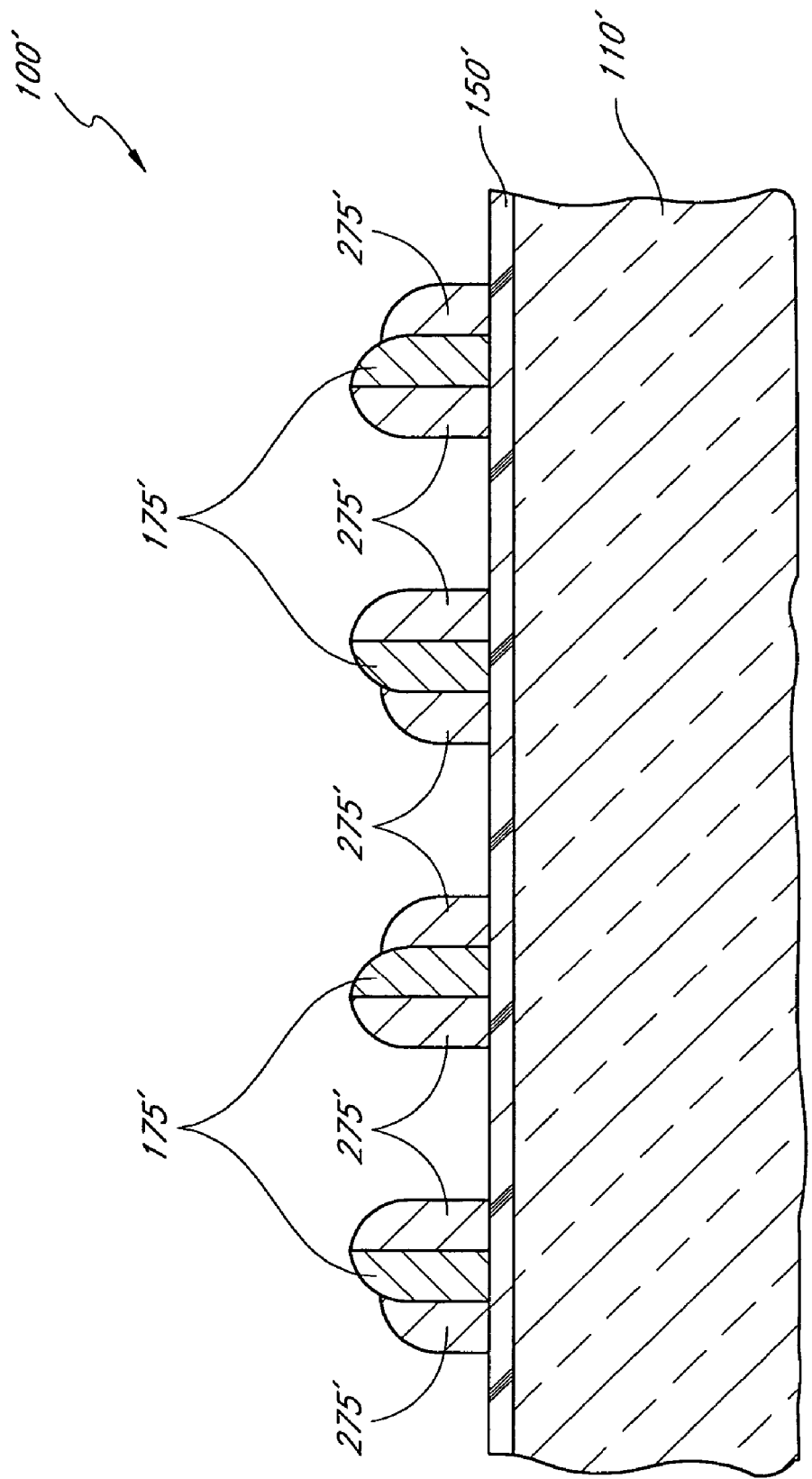
FIG. 20 is a schematic, cross-sectional side view of the partially formed integrated circuit of FIG. 19 after removing the mandrels and forming a set of spacers formed of a second spacer material around the set of spacers formed of the first spacer material, in accordance with preferred embodiments of the invention.
Figure 21:
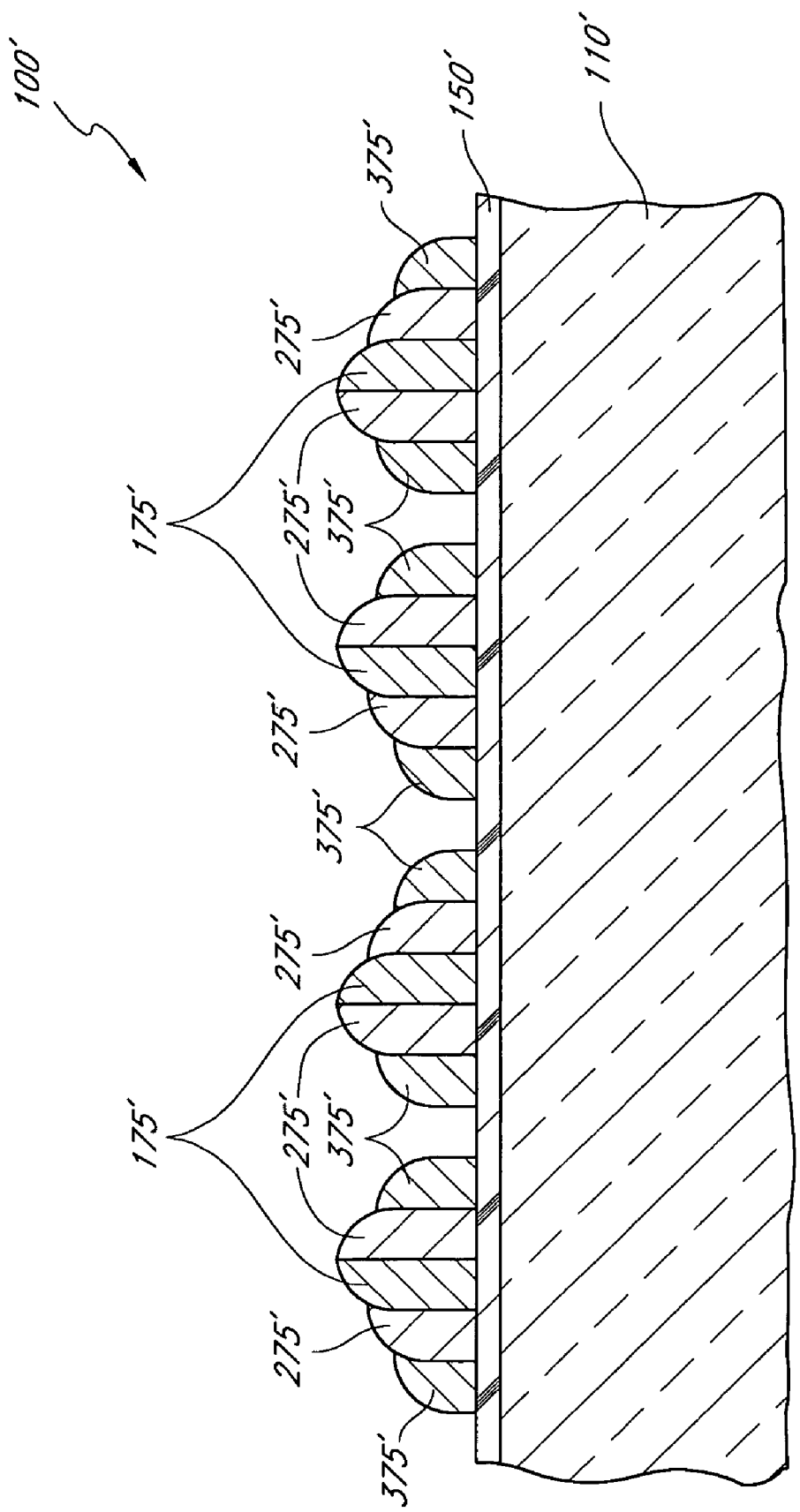
FIG. 21 is a schematic, cross-sectional side view of the partially formed integrated circuit of FIG. 20 after forming another set of spacers formed of the first spacer material, in accordance with preferred embodiments of the invention.
Figure 22:
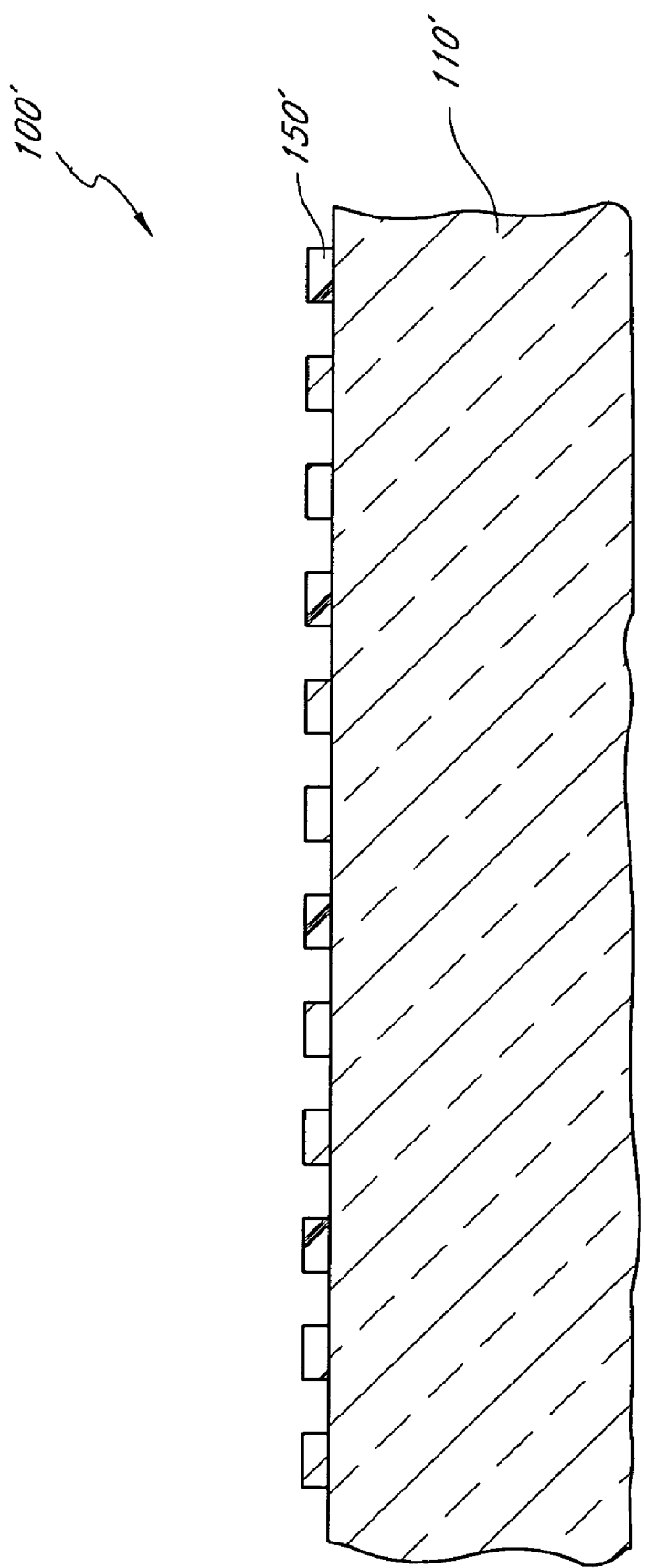
FIG. 22 is a schematic, cross-sectional side view of the partially formed integrated circuit of FIG. 21 after selectively removing the second spacer material and transferring the resulting pattern to an underlying hard mask layer, in accordance with preferred embodiments of the invention.

With reference to FIG. 20, spacers 275' are formed around the spacers 175' by depositing a layer of a second spacer material and performing a spacer etch. With reference to FIG. 21, spacers 375, formed of the first spacer material, are then formed a sidewall of each of the spacers 275'. Spacers 275' are then removed and the pattern formed by the spacers 175' and 375 is transferred to the hard mask layer 150'. As shown in FIG. 22, the spacers 175' and 375 can be removed, leaving the layer 150' as a mask to etch the substrate 110'.

Figure 23:
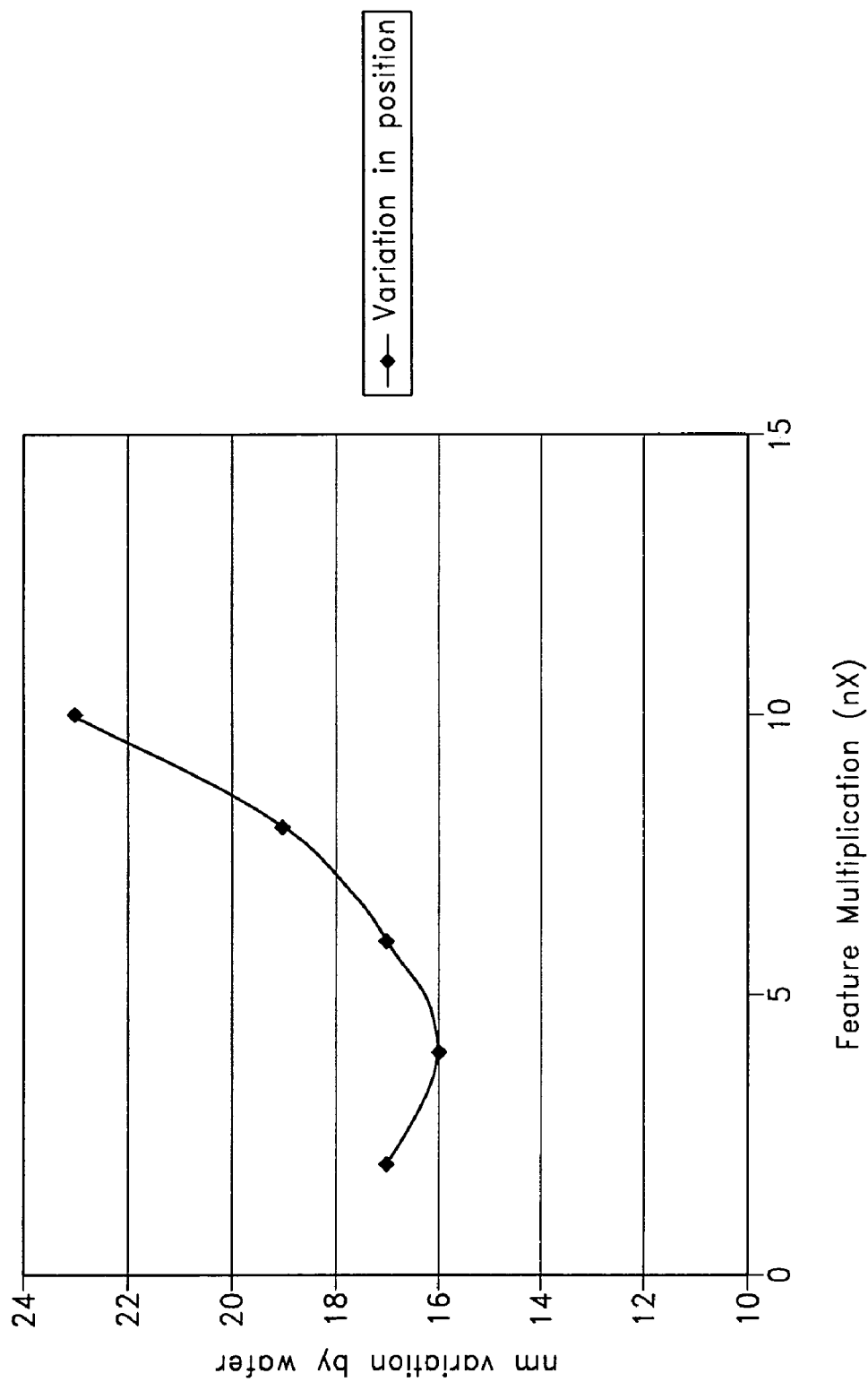
FIG. 23 is a graph showing expected variations in position for different degrees of pitch multiplication, where lithographic features are formed near the resolution limits of a photolithography system and where no mandrel critical dimension measurement and no spacer critical dimension modification is performed.
Figure 24:
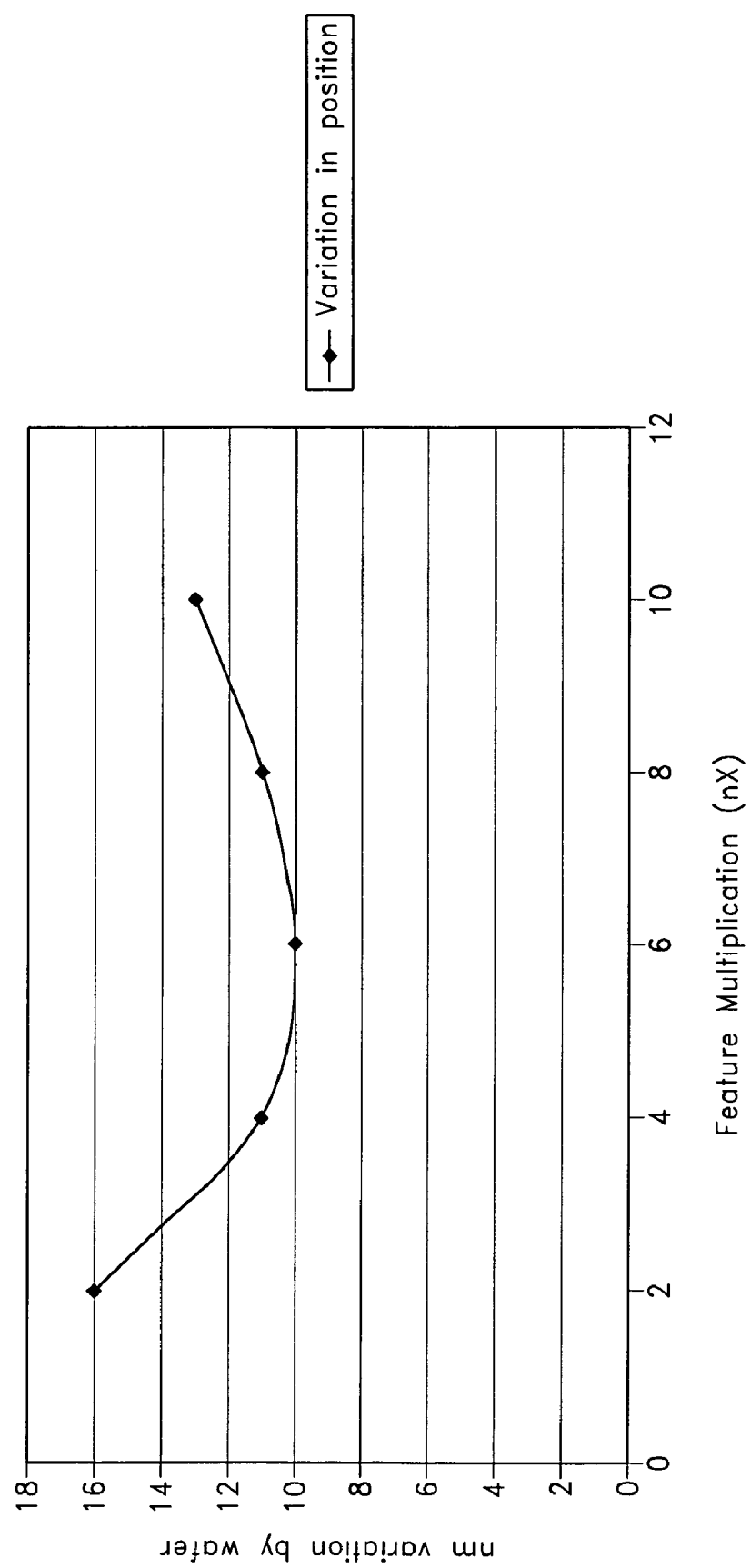
FIG. 24 is a graph showing expected variations in position for different degrees of pitch multiplication, in accordance with preferred embodiments of the invention.

It will be appreciated that the formation of spacers according to the preferred embodiments offers numerous advantages. For example, mask patterns can be formed having a pitch closer to the desired pitch for the pattern. FIGS. 23 and 24 show the expected average variations in position for wafers undergoing various degrees of pitch multiplication, with mandrels of various sizes, to ultimately arrive at a feature with a CD of 60 nm. FIG. 23 shows a pitch multiplication process in which lithographic features are formed near the resolution limits of a photolithography system and where no mandrel CD measurement and spacer CD modification is performed. FIG. 24 shows expected results from pitch multiplication performed according to the preferred embodiments.

With reference to FIG. 23, variations in position and critical dimension are expected to increase for higher degrees of multiplication, since each spacer deposition introduces new errors, compounding already-existing errors. Moreover, the initial error due to variations in mandrel CD is higher, as the photolithography system is pushed near its limits.

With reference to FIG. 24, advantageously, with larger initial mandrel features, better CD control is possible, since the photolithography system is not pushed near its limits. In addition, at various degrees of multiplication, compensation of position by varying spacer thickness is possible, leading to lower amounts of variation in position, compared to the results shown in FIG. 23.

Advantageously, the variation in the positions of spacers from one processed wafer to another is preferably less than about 14 nm and, more preferably, less than about 12 nm. Moreover, the pitch of the spacers is preferably substantially equal, preferably with a variation of about 3 nm or less, more preferably, about 2 nm or less and, most preferably, about 1 nm or less from wafer to wafer. It will be appreciated that in both FIGS. 23 and 24, the position variation of the originally formed mandrel feature can be added to the variation associated with a particular degree of pitch multiplication, to obtain the position variation budget for a process, from formation of the feature to the formation of the pitch multiplied mask.

In addition, by compensating for deviations in the critical dimensions of mandrels by altering spacer widths, etches to trim the mandrels to desired dimensions are not necessary. It will be appreciated that control over such trim etches is not typically as precise as control over the deposited thicknesses of spacer layers. Thus, correcting for pitch deviations by varying spacer thickness advantageously offers very fine control over the pitch of spacers.

This fine control increases, on average, the uniformity of spacer pitch on a substrate. The uniformity, in turn, allows process results from wafer to wafer and from lot to lot to be made more uniform. As a result, the quality and consistency of integrated circuits formed using mask derived from the spacers can be improved.

It will be appreciated that $\Delta C$ can vary between some of the mandrels 145. Using the relationships above for calculating spacer thickness may cause some of the spacers 175 and 275 to be more centered at their desired positions 185 and 285, respectively, than other of the spacers 175 and 275. Preferably, $\Delta C$ corresponds to the average variation in the critical dimensions of the mandrels 145, so that, on average, the spacers 175 and 275 are on pitch with their modified thicknesses.

In addition, while described above with one measurement step for simplicity of processing and explanation, other measurement steps can be incorporated to increase the precision of spacer placement. For example, the positions of spacer sidewalls can be measured before the formation of additional spacers on those sidewalls, to more precisely center those additional spacers.

It will also be appreciated that while discussed with reference to particular materials for the various layers and parts discussed herein, other materials can also be used. Preferably, however, any other materials that may be used offer the appropriate etch selectivity relative to the materials that are used, as discussed above.

Moreover, the substrate 110 can comprise different materials, e.g., layers of different materials, or different materials in different lateral regions of the substrate. In such cases, the primary masking layer 160 is preferably used for superior etch selectivity. To transfer the pattern defined by the spacers to such a substrate, a succession of different chemistries, preferably dry-etch chemistries, can be used to successively etch through these different materials, if a single chemistry is not sufficient to etch all the different materials. It will also be appreciated that, depending upon the chemistry or chemistries used, overlying spacers and hard mask layers may be etched. Using amorphous carbon for the primary mask layer 160, however, advantageously offers excellent resistance to conventional etch chemistries, especially those used for etching silicon-containing materials. Thus, the primary mask layer 160 can effectively be used as a mask for etching through a plurality of substrate layers, or for forming high aspect ratio trenches.

In addition to etching the substrate through masks, other types of processing through the masks are also possible. Non-limiting examples of other processes include implantation, diffusion doping, lift-off patterned deposition, oxidation, nitridation, etc.

Also, the masks discussed herein can be used to form various integrated circuit features, including, without limitation, conductive interconnect lines, landing pads and parts of various electrical devices, such as capacitors and transistors, particularly for memory and logic arrays, or flat panel displays, in which dense repeating patterns are desirable. As such, while illustrated as lines with regular spacing and regular widths for ease of illustration, the masks can have features with variable spacing. In that case, ΔC can be the average difference in mandrel critical dimensions from desired values and the critical dimensions of the spacers formed around the mandrels can be adjusted by this ΔC value. In addition, the mask can have features of variable dimensions. Optionally, the spacers can be trimmed and/or masked and etched to formed features with desired dimensions. Also, while illustrated with spacers formed on a single level, in other embodiments, spacers can be formed on multiple vertical levels and consolidated on a single level to form a mask pattern.

The preferred embodiments can also be employed multiple times throughout an integrated circuit fabrication process to form features in a plurality vertical levels, which may be vertically contiguous or non-contiguous and vertically separated. In such cases, each of the individual levels to be patterned would constitute a substrate 110. In addition, some of the preferred embodiments can be combined with other of the preferred embodiments, or with other masking methods known in the art, to form features on different areas of the same substrate 110 or on different vertical levels.

Accordingly, it will be appreciated by those skilled in the art that these and various other omissions, additions and modifications may be made to the methods and structures described above without departing from the scope of the invention. All such modifications and changes are intended to fall within the scope of the invention, as defined by the appended claims.

I claim:

1. A method for semiconductor processing, comprising:
   providing a plurality of mandrels over a semiconductor substrate;
   measuring critical dimensions of the mandrels;
   subsequently selecting a first critical dimension of a first plurality of spacers based upon the critical dimensions of the mandrels, the spacers of the first plurality of spacers having a first predefined desired critical dimension, wherein selecting critical dimensions of the first plurality of spacers adjusts the first predefined desired critical dimensions to position centers of the spacers of the first plurality of spacers substantially at a desired first pitch;
   forming the first plurality of spacers of a first spacer material on sidewalls of the mandrels;
   selectively removing the mandrels;
   subsequently selecting a second critical dimension of a second plurality of spacers based upon the critical dimensions of the first plurality of spacers, the spacers of the second plurality of spacers having a second predefined desired critical dimension, wherein selecting critical dimensions of the second plurality of spacers adjusts the second predefined desired critical dimensions to position centers of the spacers of the second plurality of spacers substantially at a desired second pitch; and
   forming the second plurality of spacers of a second spacer material on sidewalls of the spacers of the first plurality of spacers.

2. The method of claim 1, wherein a pitch of the first plurality of spacers is substantially uniform.

3. The method of claim 1, wherein the first spacer material is silicon nitride.

4. The method of claim 1, wherein the second spacer material is silicon oxide.

5. The method of claim 4, wherein a pitch of the second plurality of spacers is substantially uniform.

6. The method of claim 4, wherein the pitch of the second plurality of spacers is equal to about ¼ of a pitch of the mandrels.

7. The method of claim 1, further comprising selectively removing the first plurality of spacers relative to the second plurality of spacers.

8. The method of claim 7, further comprising transferring a pattern formed by the second plurality of spacers to a hard mask underlying the spacers.

9. The method of claim 8, further comprising processing the substrate through the hard mask.

10. The method of claim 9, wherein processing the substrate though the hard mask comprises transferring the pattern formed by the second plurality of spacers to the substrate.

11. The method of claim 1, further comprising forming a third plurality of spacers on sidewalls of the second plurality of spacers.

12. The method of claim 11, wherein forming the third plurality of spacers comprises selecting the critical dimensions of the third plurality of spacers based upon the critical dimensions of the mandrels.

13. The method of claim 11, wherein the third plurality of spacers are formed of the first spacer material.

14. The method of claim 13, wherein the third spacer material is silicon nitride.

15. The method of claim 13, further comprising selectively etching the second spacer material relative to the first spacer material.

16. The method of claim 1, further comprising selectively etching the mandrels relative to the spacers.

17. The method of claim 16, wherein the mandrels are formed of amorphous carbon.

18. A method for forming an integrated circuit, comprising:
   defining a pattern in a photoresist layer over a substrate by a photolithographic technique;
   transferring the pattern from the photoresist layer to an underlying layer of temporary material, wherein transferring the pattern from the photoresist layer forms a plurality of temporary placeholders in the layer of temporary material across a region over the substrate;
   determining a position of sidewalls of the temporary placeholders;
   depositing a layer of spacer material on the temporary placeholders, the layer of spacer material having a predefined desired thickness;
   adjusting an actual thickness of the deposited layer of spacer material based upon the position of the sidewalls;
   preferentially removing spacer material from horizontal surfaces to form a plurality of vertically extending spacers on sidewalls of the temporary placeholders;
   preferentially removing the temporary placeholders; and
   processing the substrate through a mask pattern defined by the plurality of spacers.

19. The method of claim 18, wherein the photolithographic technique has a minimum feature size, wherein a critical dimension of features forming the pattern is more than about 200% of the minimum feature size.

20. The method of claim 19, wherein defining the pattern in the photoresist layer comprises performing photolithography using light having a wavelength of 248 nm.

21. The method of claim 18, wherein depositing the layer of spacer material is performed without performing a trim etch on the temporary placeholders or on the photoresist layer after defining the pattern.

22. The method of claim 18, wherein determining the position of sidewalls of the temporary placeholders comprises measuring the temporary placeholders by scatterometry.

23. The method of claim 18, further comprising, after removing the temporary placeholders and before processing the substrate:
depositing a layer of a second spacer material; and
anisotropically etching the layer of the second spacer material to form an additional plurality of spacers on sidewalls of the plurality of vertically extending spacers.

24. The method of claim 18, wherein the temporary material comprises amorphous carbon.

25. The method of claim 24, wherein the spacer material comprises a silicon-containing material.

26. The method of claim 25, wherein the spacer material comprises silicon nitride.

27. The method of claim 18, wherein the temporary placeholders are wider than a desired width for the temporary placeholders, wherein adjusting the thickness of the layer of spacer material comprises depositing the layer of spacer material to a thickness less than a hypothetical thickness for the layer of spacer material if a width of the temporary placeholders were equal to the desired width for the temporary placeholders.

28. The method of claim 18, wherein preferentially removing spacer material from horizontal surfaces comprises performing an anisotropic etch.

29. The method of claim 18, wherein preferentially removing the temporary placeholders comprises subjecting the temporary placeholders to an oxygen-containing plasma.

30. The method of claim 18, wherein processing the substrate comprises etching through a plurality of different materials.

31. The method of claim 18, wherein processing the substrate defines features of a logic array.

32. The method of claim 18, wherein processing the substrate defines features of a gate array.

33. The method of claim 18, wherein processing the substrate defines features of a memory array.

34. The method of claim 18, wherein processing the substrate defines features of a computer processor.

35. A method for manufacturing an integrated circuit, comprising:
forming a plurality of mandrels over a substrate in a reaction chamber;
transferring the substrate from the reaction chamber to a measurement station to perform a measurement of the mandrels after forming the plurality of mandrels;
transferring the substrate to a reaction chamber after performing the measurement;
depositing a layer of spacer material on sidewalls of the mandrels, the layer of spacer material having a predefined desired thickness, wherein a thickness of the layer is increased or decreased from the predefined desired thickness based upon the measurement;
etching the layer of spacer material to form spacers on the sidewalls; and
selectively removing the mandrels to leave free-standing spacers.

36. The method of claim 35, wherein the measurement station performs scatterometry.

37. The method of claim 35, wherein the measurement station measures a critical dimension of the mandrels.

38. The method of claim 35, wherein depositing the layer of spacer material comprises performing an atomic layer deposition.

39. The method of claim 35, wherein the spacer material comprises silicon nitride.

40. The method of claim 35, wherein transferring the substrate to the reaction chamber comprises transferring the substrate into the same chamber used for forming the plurality of mandrels.

41. The method of claim 35, further comprising depositing a layer of an other spacer material over the spacers after removing the mandrels.

42. The method of claim 41, further comprising etching the layer of the other spacer material to form a plurality of spacers of the other spacer material.

43. The method of claim 42, further comprising selectively removing the spacers to leave the plurality of spacers of the other spacer material.

* * * * *

UNITED STATES PATENT AND TRADEMARK OFFICE
CERTIFICATE OF CORRECTION

| | |
|---|---|
| PATENT NO. | : 7,396,781 B2 |
| APPLICATION NO. | : 11/150408 |
| DATED | : July 8, 2008 |
| INVENTOR(S) | : Wells |

It is certified that error appears in the above-identified patent and that said Letters Patent is hereby corrected as shown below:

On the Title page, item (56), under "Foreign Patent Documents", in column 2, line 1, delete "DE" and insert -- DD --, therefor.

On the Title page, item (57), under "Abstract", in column 2, line 5, delete "sideswalls." and insert -- sidewalls. --, therefor.

In column 18, line 15, in Claim 10, delete "though" and insert -- through --, therefor.

Signed and Sealed this

Sixteenth Day of September, 2008

JON W. DUDAS
*Director of the United States Patent and Trademark Office*